(12) United States Patent
Kikuchi et al.

(10) Patent No.: US 11,393,849 B2
(45) Date of Patent: Jul. 19, 2022

(54) ACTIVE MATRIX SUBSTRATE AND METHOD FOR MANUFACTURING SAME

(71) Applicant: Sharp Kabushiki Kaisha, Sakai (JP)

(72) Inventors: Tetsuo Kikuchi, Sakai (JP); Tohru Daitoh, Sakai (JP); Hajime Imai, Sakai (JP); Masahiko Suzuki, Sakai (JP); Setsuji Nishimiya, Sakai (JP); Kengo Hara, Sakai (JP); Masamitsu Yamanaka, Sakai (JP); Hitoshi Takahata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 232 days.

(21) Appl. No.: 16/892,327

(22) Filed: Jun. 4, 2020

(65) Prior Publication Data

US 2020/0388637 A1 Dec. 10, 2020

Related U.S. Application Data

(60) Provisional application No. 62/857,847, filed on Jun. 6, 2019.

(51) Int. Cl.
*H01L 27/12* (2006.01)
*G02F 1/1368* (2006.01)
*G02F 1/1362* (2006.01)

(52) U.S. Cl.
CPC .......... *H01L 27/124* (2013.01); *G02F 1/1368* (2013.01); *G02F 1/136286* (2013.01); *H01L 27/1225* (2013.01); *H01L 27/1259* (2013.01)

(58) Field of Classification Search
CPC ............... H01L 27/124; H01L 27/1225; H01L 27/1259; G02F 1/136286; G02F 1/1368; G02F 1/13685; G02F 1/13452; G02F 1/133603

See application file for complete search history.

(56) References Cited

U.S. PATENT DOCUMENTS

2015/0301415 A1   10/2015   Sawada et al.
2017/0090229 A1    3/2017   Imai et al.

FOREIGN PATENT DOCUMENTS

JP   2015-109315 A    6/2015
WO   2014/069279 A1   5/2014
WO   2015/186619 A1  12/2015

*Primary Examiner* — Nikolay K Yushin
(74) *Attorney, Agent, or Firm* — Keating & Bennett, LLP

(57) ABSTRACT

An active matrix substrate includes a substrate, a plurality of oxide semiconductor TFTs, a plurality of gate bus lines, a plurality of source bus lines, and at least one trunk wiring provided in a non-display region and transmitting a signal, and a plurality of other wirings, each of which is disposed so as to at least partially overlap the trunk wirings. The active matrix substrate includes a first metal layer, a second metal layer disposed above the first metal layer, and a third metal layer disposed above the second metal layer on the substrate. One of the first, second, and third metal layers includes a source bus line, and other layer includes a gate bus line. The trunk wiring is formed in two metal layer of the first, second and third metal layers.

20 Claims, 22 Drawing Sheets

GDM SIGNAL INPUT

ACTIVE MATRIX SUBSTRATE AND METHOD FOR MANUFACTURING SAME

CROSS REFERENCE TO RELATED APPLICATION

The present application claims priority from U.S. Provisional Application No. 62/857,847, filed Jun. 6, 2019, the entire contents of which are hereby incorporated by reference into this application.

BACKGROUND OF THE INVENTION

1. Field of the Invention

The present invention relates to an active matrix substrate and a method for manufacturing the same.

2. Description of the Related Art

An active matrix substrate used for a display device includes a display region having a plurality of pixel regions and a non-display region other than the display region (also referred to as a "frame region" or a "peripheral region"). The pixel region is a region corresponding to a pixel of the display device. In each pixel region, a thin film transistor (hereinafter, "TFT") is disposed as a switching element. The TFT disposed in each pixel region is called "pixel TFT".

A plurality of source bus lines and a plurality of gate bus lines are provided on the TFT substrate, and pixel TFTs are disposed near intersection portions of these. A source electrode of the pixel TFT is coupled to one of the source bus lines, and a gate electrode is coupled to one of the gate bus lines. Therefore, normally, the source electrode is formed using the same conductive film (source conductive film) as the source bus line, and the gate electrode is formed using the same conductive film (gate conductive film) as the gate bus line. In the present specification, a layer including an electrode and a wiring formed using the source conductive film is referred to as a "source metal layer", and a layer including an electrode and a wiring formed using the gate conductive film is referred to as a "gate metal layer".

A peripheral circuit such as a gate driver circuit may be formed monolithically (integrally) in a non-display region of the TFT substrate. For example, International Application Publication No. WO2014/069279 discloses a TFT substrate provided with a gate driver formed monolithically (referred to as a "monolithic gate driver"). The monolithic gate driver includes a shift register having a plurality of stages. Various signals are input to each stage of the shift register via a plurality of trunk wirings (gate driver signal trunk wirings). Each stage of the shift register outputs a gate signal to a corresponding gate bus line.

In recent years, it has been proposed to use an oxide semiconductor instead of amorphous silicon or polycrystalline silicon as a material for an active layer of the TFT. Such a TFT is referred to as an "oxide semiconductor TFT". The oxide semiconductor has higher mobility than amorphous silicon. Therefore, the oxide semiconductor TFT can operate at higher speed than an amorphous silicon TFT. Since an oxide semiconductor film is formed by a simpler process than a polycrystalline silicon film, the oxide semiconductor film can be applied to an apparatus which requires a large area.

Most oxide semiconductor TFTs are bottom gate type TFTs, and a top gate type oxide semiconductor TFT has also been proposed. For example, Japanese Patent Application Publication No. 2015-109315 discloses a top gate type TFT in which a gate electrode is provided on a portion of an oxide semiconductor layer via a gate insulating layer interposed therebetween, and source and drain electrodes are provided on an insulating layer which covers the gate electrode.

International Application Publication No. WO2015/186619 by the present applicant proposes a substrate structure (hereinafter, "lower source structure") in which a source electrode and a source bus line are provided closer to a substrate side than a gate bus line and an oxide semiconductor layer of an oxide semiconductor TFT.

SUMMARY OF THE INVENTION

In the non-display region of the TFT substrate, a plurality of trunk wirings for transmitting various signals, such as a gate driver signal trunk wiring, are formed. These trunk wirings are normally formed using a source conductive film or a gate conductive film (in a source metal layer or a gate metal layer). As a result of the study by the present inventor, in the TFT substrate in the related art, rounding in a signal waveform may be occurred or a potential change may occur due to the wiring resistance in the trunk wiring. Details will be described later.

An embodiment of the present invention provides an active matrix substrate provided with an oxide semiconductor TFT and capable of reducing the resistance of a trunk wiring formed in a non-display region.

The present specification discloses an active matrix substrate and a method for manufacturing the active matrix substrate described in the following items.

[Item 1] An aspect of the present invention provides an active matrix substrate that includes a display region including a plurality of pixel regions, and a non-display region other than the display region, the active matrix substrate including a substrate, a plurality of oxide semiconductor TFTs that is supported by the substrate and each disposed in association with the plurality of pixel regions, a plurality of gate bus lines that supplies a gate signal to the plurality of oxide semiconductor TFTs, a plurality of source bus lines that supplies a source signal to the plurality of oxide semiconductor TFTs, at least one trunk wiring that is provided in the non-display region and transmits a signal, and a plurality of other wirings, each of which is disposed so as to at least partially overlap the at least one trunk wiring, when viewed from a normal direction of the substrate, in which the active matrix substrate includes a first metal layer that includes an electrode and/or a wiring formed of a first conductive film on the substrate, a second metal layer that is disposed above the first metal layer with an insulating layer interposed therebetween, and includes an electrode and/or a wiring formed of a second conductive film, and a third metal layer that is disposed above the second metal layer with an insulating layer interposed therebetween, and includes an electrode and/or a wiring formed of a third conductive film, one of the first metal layer, the second metal layer, and the third metal layer includes the plurality of source bus lines, and other layer includes the plurality of gate bus lines, the at least one trunk wiring is formed in two metal layers of the first metal layer, the second metal layer, and the third metal layer, and the plurality of other wirings are formed in other one metal layer, and the at least one trunk wiring includes a multilayer structure that includes a lower wiring formed in one of the two metal layers and an upper wiring formed in the other of the two metal layers and disposed on the lower wiring with an insulating layer interposed therebetween, and the lower wiring and the upper wiring are electrically coupled to each other.

[Item 2] In the active matrix substrate according to Item 1, each of the plurality of oxide semiconductor TFTs includes an oxide semiconductor layer and a gate electrode disposed on a portion of the oxide semiconductor layer with a gate insulating layer interposed therebetween, the first metal layer is located closer to the substrate side than the oxide semiconductor layer, and the second metal layer includes the gate electrode and the plurality of gate bus lines.

[Item 3] In the active matrix substrate according to Item 2, the first metal layer includes source electrodes of the plurality of oxide semiconductor TFTs and the plurality of source bus lines, and the third metal layer includes drain electrodes of the plurality of oxide semiconductor TFTs.

[Item 4] In the active matrix substrate according to Item 2, the first metal layer includes light shielding layers of the plurality of oxide semiconductor TFTs, and the third metal layer includes drain electrodes and source electrodes of the plurality of oxide semiconductor TFTs, and the plurality of source bus lines.

[Item 5] In the active matrix substrate according to any one of Items 3 or 4, the plurality of other wirings are a plurality of branch wirings to which the signal is input from the at least one trunk wiring, the active matrix substrate further includes a trunk wiring coupling portion that electrically couples each of the branch wirings to the at least one trunk wiring, and the trunk wiring coupling portion is disposed in a region where each of the branch wirings and the at least one trunk wiring at least partially overlap each other when viewed from the normal direction of the substrate.

[Item 6] The active matrix substrate according to Item 5, further including a gate driver that is disposed in the non-display region and includes a shift register having a plurality of stages, in which the at least one trunk wiring is at least one gate driver signal trunk wiring that transmits the signal input to the gate driver, and the signal is input from the at least one gate driver signal trunk wiring to the plurality of stages of the shift register via the plurality of branch wirings.

[Item 7] In the active matrix substrate according to Item 5 or 6, the lower wiring of the at least one trunk wiring is formed in the second metal layer, and the upper wiring is formed in the third metal layer, and the plurality of branch wirings are formed in the first metal layer.

[Item 8] In the active matrix substrate according to Item 5 or 6, the lower wiring of the at least one trunk wiring is formed in the first metal layer, and the upper wiring is formed in the second metal layer, and the plurality of branch wirings are formed in the third metal layer.

[Item 9] In the active matrix substrate according to Item 5 or 6, the lower wiring of the at least one trunk wiring is formed in the first metal layer, and the upper wiring is formed in the third metal layer, and the plurality of branch wirings are formed in the second metal layer.

[Item 10] In the active matrix substrate according to Item 9, the at least one trunk wiring includes a first trunk wiring and a second trunk wiring, the plurality of branch wirings include a first branch wiring electrically coupled to the first trunk wiring and electrically separated from the second trunk wiring, the first branch wiring extends to the first trunk wiring across the second trunk wiring, when viewed from the normal direction of the substrate, and the upper wiring or the lower wiring in the second trunk wiring includes a cutout portion in an intersection portion of the second trunk wiring and the first branch wiring.

[Item 11] In the active matrix substrate according to any one of Items 5 to 10, each of the plurality of oxide semiconductor TFTs includes an oxide semiconductor layer and a gate electrode disposed on a portion of the oxide semiconductor layer with a gate insulating layer interposed therebetween, the first metal layer is located closer to the substrate side than the oxide semiconductor layer, the second metal layer includes the gate electrode and the plurality of gate bus lines, in the trunk wiring coupling portion, among the upper wiring, the lower wiring, and each of the branch wirings, a wiring formed in the first metal layer includes a first coupling layer, a wiring formed in the second metal layer includes a second coupling layer, and a wiring formed in the third metal layer includes a third coupling layer, and the trunk wiring coupling portion includes the first coupling layer, a lower insulating layer that extends on the first coupling layer and has a first opening portion exposing a portion of the first coupling layer, the second coupling layer that is disposed on the lower insulating layer and in the first opening portion, and disposed on a first portion of an exposed portion of the first coupling layer in the first opening portion with the gate insulating layer interposed therebetween, an interlayer insulating layer that extends on the second coupling layer and the lower insulating layer and has a second opening portion exposing a portion of the second coupling layer and a second portion not covered by the gate insulating layer in the exposed portion of the first coupling layer, and a third coupling layer that is disposed on the interlayer insulating layer and is in contact with the portion of the second coupling layer and the second portion of the first coupling layer in the second opening portion.

[Item 12] In the active matrix substrate according to any one of Items 5 to 10, each of the plurality of oxide semiconductor TFTs includes an oxide semiconductor layer and a gate electrode disposed on a portion of the oxide semiconductor layer with a gate insulating layer interposed therebetween, the first metal layer is located closer to the substrate side than the oxide semiconductor layer, the second metal layer includes the gate electrode and the plurality of gate bus lines, in the trunk wiring coupling portion, among the upper wiring, the lower wiring, and each of the branch wirings, a wiring formed in the first metal layer includes a first coupling layer, a wiring formed in the second metal layer includes a second coupling layer, and a wiring formed in the third metal layer includes a third coupling layer, the trunk wiring coupling portion includes the first coupling layer, a lower insulating layer that extends on the first coupling layer, the second coupling layer that is disposed on the lower insulating layer with the gate insulating layer interposed therebetween, and overlaps a first portion of the first coupling layer when viewed from the normal direction of the substrate, an interlayer insulating layer that extends on the second coupling layer and the lower insulating layer, and a third coupling layer that is disposed on the interlayer insulating layer and in a contact hole made in the interlayer insulating layer and the lower insulating layer, the contact hole including a first opening portion made in the lower insulating layer and a second opening portion made in the interlayer insulating layer, the third coupling layer being in contact with a portion of the second coupling layer and a second portion not overlapping the second coupling layer in the first coupling layer, in the contact hole, and a portion of a side surface of the first opening portion is aligned with the second opening portion, and the other portion is aligned with a side surface of the second coupling layer, when viewed from the normal direction of the substrate.

[Item 13] In the active matrix substrate according to any one of Items 5 to 10, each of the plurality of oxide semiconductor TFTs includes an oxide semiconductor layer and a gate electrode disposed on a portion of the oxide semiconductor layer with a gate insulating layer interposed therebetween, the first metal layer is located closer to the substrate side than the oxide semiconductor layer, the second metal layer includes the gate electrode and the plurality of gate bus lines, in the trunk wiring coupling portion, among the upper wiring, the lower wiring, and each of the branch wirings, a wiring formed in the first metal layer includes a first coupling layer, a wiring formed in the second metal layer includes a second coupling layer, and a wiring formed in the third metal layer includes a third coupling layer, and the trunk wiring coupling portion includes the first coupling layer, a lower insulating layer that extends on the first coupling layer and has a first opening portion exposing a portion of the first coupling layer, an oxide layer that is formed using the same oxide film as the oxide semiconductor layer, and disposed on the lower insulating layer and in the first opening portion, the second coupling layer that is disposed on a portion of the oxide layer with the gate insulating layer interposed therebetween, an interlayer insulating layer that extends on the second coupling layer and the oxide layer, and has a second opening portion exposing a portion of the second coupling layer and the other portion of the oxide layer, and the third coupling layer that is disposed on the interlayer insulating layer and in contact with the portion of the second coupling layer and the other portion of the oxide layer in the second opening portion.

[Item 14] In the active matrix substrate according to any one of Items 1 to 4, the at least one trunk wiring is a common signal trunk wiring that transmits a common signal, and the plurality of other wirings are the plurality of source bus lines or the plurality of gate bus lines, the common signal trunk wiring is electrically separated from the plurality of source bus lines and the plurality of gate bus lines, the common signal trunk wiring includes a first wiring unit intersecting with the plurality of source bus lines and a second wiring unit intersecting with the plurality of gate bus lines, when viewed from the normal direction of the substrate, the first wiring unit includes a multilayer structure formed in two metal layers other than the source bus lines among the first metal layer, the second metal layer, and the third metal layer, and the second wiring unit includes a multilayer structure formed in two metal layers other than the gate bus lines among the first metal layer, the second metal layer, and the third metal layer.

[Item 15] In the active matrix substrate according to Item 14, the upper wiring or the lower wiring of the common signal trunk wiring includes a cutout portion at an intersection portion of the common signal trunk wiring and the plurality of source bus lines or the plurality of gate bus lines.

[Item 16] The active matrix substrate according to any one of Items 1 to 15, further including an upper insulating layer disposed on the third metal layer, and a common electrode and a plurality of pixel electrodes disposed on the upper insulating layer.

[Item 17] In the active matrix substrate according to any one of Items 1 to 16, each of the first metal layer, the second metal layer, and the third metal layer is a metal layer containing Cu or Al, or includes a laminated structure including the metal layer as an uppermost layer.

[Item 18] The active matrix substrate according to Item 3, further including another oxide semiconductor TFT that is disposed in the non-display region, in which a gate electrode of another oxide semiconductor TFT is formed in the second metal layer, a source electrode and a drain electrode of another oxide semiconductor TFT are formed in the third metal layer, and the first metal layer includes light shielding layers of the plurality of oxide semiconductor TFTs and a light shielding layer of another oxide semiconductor TFT.

[Item 19] In the active matrix substrate according to any one of Items 2 to 18, the oxide semiconductor layer includes an In—Ga—Zn—O-based semiconductor.

[Item 20] In the active matrix substrate according to Item 19, the In—Ga—Zn—O-based semiconductor includes a crystalline portion.

[Item 21] An aspect of the present invention provides a method for manufacturing the active matrix substrate according to Item 12, the method including forming the first metal layer that includes the first coupling layer on the substrate, forming the lower insulating layer so as to cover the first metal layer, forming the oxide semiconductor layer of the plurality of oxide semiconductor TFTs, by forming an oxide semiconductor film on the lower insulating layer and patterning the oxide semiconductor film, the oxide semiconductor film being patterned in a state where the first coupling layer is covered with the lower insulating layer, forming a gate insulating layer and a second metal layer, by forming the gate insulating film and the second conductive film in this order so as to cover the oxide semiconductor layer and patterning the gate insulating film and the second conductive film, the second metal layer including the gate electrode and the second coupling layer, forming the interlayer insulating layer on the second metal layer, patterning the interlayer insulating layer and the lower insulating layer using a resist mask provided on the interlayer insulating layer and the second coupling layer as a mask, and making the contact hole exposing a portion of the second coupling layer and the second portion of the first coupling layer, and forming a third metal layer including the third coupling layer on the interlayer insulating layer.

[Item 22] An aspect of the present invention provides a method for manufacturing the active matrix substrate according to Item 13, the method including forming the first metal layer that includes the plurality of source bus lines, the source electrodes of the plurality of oxide semiconductor TFTs, and the first coupling layer on the substrate, forming the lower insulating layer so as to cover the first metal layer, and forming a source-side opening portion exposing a portion of the source electrode and the first opening portion exposing the portion of the first coupling layer in the lower insulating layer, forming the oxide semiconductor layer in contact with the source electrode in the source-side opening portion and the oxide layer in contact with the first coupling layer in the first opening portion, by forming an oxide semiconductor film on the lower insulating layer and patterning the oxide semiconductor film, forming a gate insulating layer and a second metal layer, by forming the gate insulating film and the second conductive film in this order so as to cover the oxide semiconductor layer and the oxide layer, and patterning the gate insulating film and the second conductive film, the second metal layer including the gate electrode and the second coupling layer, forming the interlayer insulating layer on the second metal layer, and making a drain-side opening portion exposing a portion of the drain electrode and the second opening portion exposing the portion of the second coupling layer and the other portion of the oxide layer on the interlayer insulating layer, and forming the third metal layer on the interlayer insulating layer, the third metal layer including the drain electrode in contact with the oxide semiconductor layer in the drain-side opening portion and the third coupling layer in contact with the portion of the second coupling layer and the other portion of the oxide layer in the second opening portion.

[Item 23] In the method for manufacturing an active matrix substrate according to item 21 or 22, the first metal layer is a metal layer containing Cu or Al, or has a laminated structure including the metal layer as an uppermost layer, and patterning of the oxide semiconductor film is performed using a PAN-based etching solution containing phosphoric acid, nitric acid, and acetic acid.

[Item 24] In the method for manufacturing according to any one of Items 21 to 23, the oxide semiconductor film includes an In—Ga—Zn—O-based semiconductor.

[Item 25] In the method for manufacturing according to Item 24, the In—Ga—Zn—O-based semiconductor includes a crystalline portion.

According to an embodiment of the present invention, there is provided the active matrix substrate provided with the oxide semiconductor TFT and capable of reducing the resistance of the trunk wiring formed in the non-display region.

DETAILED DESCRIPTION OF THE INVENTION

Hereinafter, findings found as a result of a study by the present inventor will be described with reference to the drawings.

As described above, in the TFT substrate in the related art, rounding in a waveform of a signal transmitted by a trunk wiring may be occurred or a potential change may occur due to a wiring resistance of the trunk wiring.

Figure 18A:
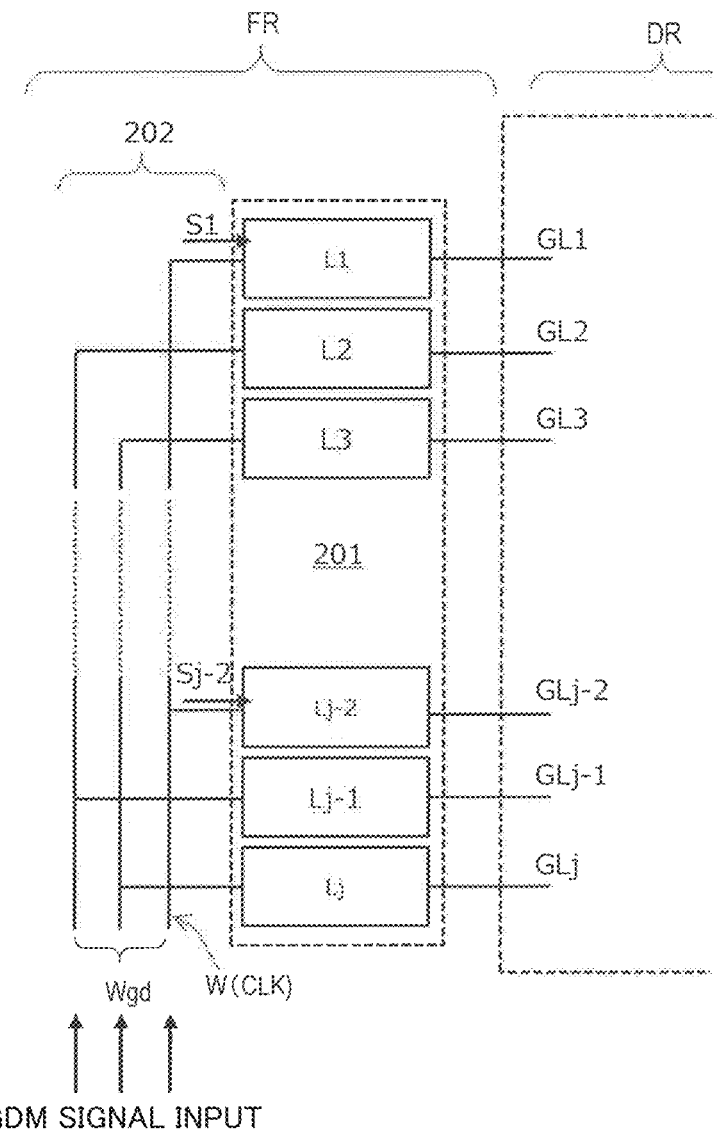
FIG. 18A is a schematic diagram illustrating a region including a gate driver GD in a non-display region of a TFT substrate.

FIG. 18A is a schematic diagram illustrating a region including a monolithic gate driver GD in a non-display region of a TFT substrate.

The gate driver GD is provided with a shift register 201 including a plurality of stages (bistable circuits) L1 to Lj (j is an integer of 2 or more). Each stage of the shift register 201 outputs a gate signal to the corresponding gate bus line GL1 to GLj.

In a GD forming region, a plurality of GDM signal trunk wirings Wgd for supplying various signals (collectively referred to as "GDM signals") to each stage of the shift register 201 are disposed. The plurality of GDM signal trunk wirings Wgd extend, for example, in a direction intersecting with the gate bus lines GL. A region 202 where the GDM signal trunk wirings Wgd are disposed is called a "GDM signal trunk wiring forming region". The GDM signal trunk wiring Wgd includes, for example, a clock signal trunk wiring W (CLK) transmitting a clock signal CLK input from a gate driver control unit, and a VSS signal trunk wiring W (VSS) transmitting a low-potential power supply voltage signal VSS (hereinafter, VSS signal) input from a power supply unit. Each GDM signal trunk wiring Wgd is coupled to each stage of the shift register 201 via a branch wiring.

Figure 18B:
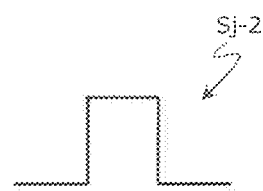
FIG. 18B and FIG. 18C are diagrams illustrating a signal waveform input from a GDM signal trunk wiring in the related art to a branch wiring.
Figure 18C:
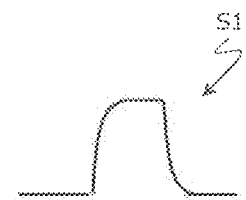

In the gate driver GD having the above configuration, a clock signal Sj-2 having a predetermined waveform (small rounding) is input to the bistable circuit (for example, bistable circuit Lj-2) coupled to the upstream side (signal input side) of the clock signal trunk wiring W (CLK), as illustrated in FIG. 18B. However, as illustrated in FIG. 18C, a relatively large rounding may occur in the waveform of a clock signal S1 input to the bistable circuit (for example, bistable circuit L1) coupled downstream of the clock signal trunk wiring W (CLK). It is considered that this is because the resistance and a parasitic capacitance of the clock signal trunk wiring W (CLK) are increased. In particular, when the frequency of the clock signal CLK is higher and the pulse is narrower, the influence of rounding is significant.

When the waveform of the GDM signal input to the bistable circuit has a rounding, the gate signal output from the bistable circuit may also be rounded.

On the other hand, a VSS signal input to the VSS signal trunk wiring W (VSS) has a DC potential, and is affected by a leak current of the TFT included in the shift register 201, the clock signal CLK, and the like, and thus the VSS signal trunk wiring W (VSS) may change.

In particular, when the number of stages of the shift register 201 increases due to the high definition of the TFT substrate, or when the GDM signal trunk wiring Wgd increases due to the enlargement of the TFT substrate, such a rounding of the waveform of the GDM signal and a potential change are more likely to occur.

Here, the clock signal trunk wiring W (CLK) and the VSS signal trunk wiring W (VSS) are described as an example, and a similar problem may occur in another GDM signal trunk wiring Wgd or a trunk wiring other than the GDM signal trunk wiring Wgd.

For example, there is a problem that a common signal potential change may occur in the common signal trunk wiring Wcom for inputting the common signal COM to a common electrode CE.

Figure 19:
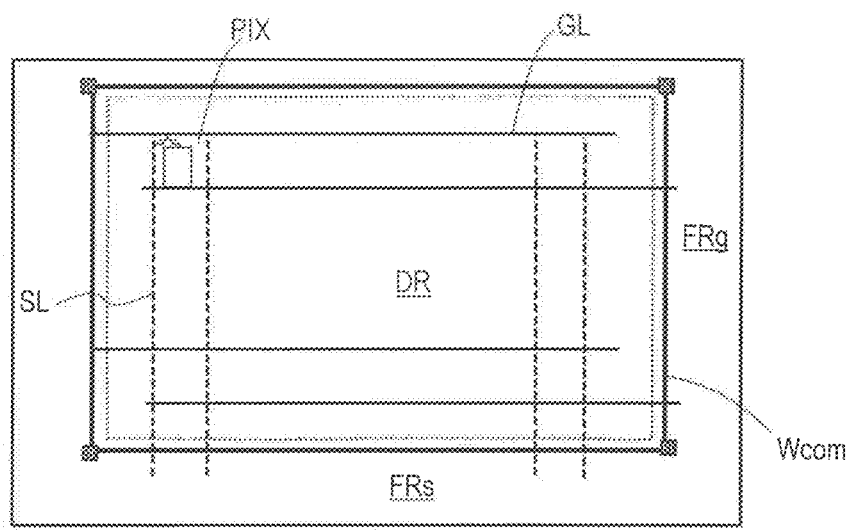
FIG. 19 is a plan view illustrating the common signal trunk wiring Wcom.

As illustrated in FIG. 19, in the non-display region FR of the TFT substrate, the common signal trunk wiring Wcom is provided in a ring shape so as to surround the display region DR. In a source-side region FRs where the source bus line SL extends among the non-display region FR, the common signal trunk wiring Wcom is formed, for example, in a gate metal layer. In a gate-side region FRg where the gate bus line GL extends, the common signal trunk wiring Wcom is formed, for example, in a source metal layer.

In the source-side region FRs, the common signal trunk wiring Wcom is disposed to cross a plurality of source bus lines SL. When the wiring resistance of the common signal trunk wiring Wcom is high, the potential of the common signal trunk wiring Wcom may change under the influence of the source signal of the source bus line SL. The same applies to the gate-side region FRg, and the potential of the common signal trunk wiring Wcom can change under the influence of the gate signal of the gate bus line GL.

As a result of the study based on the above findings, the present inventor found that by providing another metal layer on the TFT substrate, in addition to the source metal layer and the gate metal layer, and using three layers of a source metal layer, a gate metal layer, and another metal layer, the resistance of the trunk wiring can be reduced, and reached the present invention.

In an embodiment of the present invention, a trunk wiring having a multilayer structure is formed using two layers of the three metal layers described above, and the other wiring that partially overlaps the trunk wiring when viewed from a normal direction of the substrate is formed using the other metal layer.

In the present specification, the "trunk wiring" refers to a wiring that is coupled to, for example, a control unit or a power supply unit provided outside the active matrix substrate and transmits a primary signal, and includes, for example, the GDM signal trunk wiring, the common signal trunk wiring, and the control signal trunk wiring of the SSD circuit. The "other wiring partially overlapping the trunk wiring" may be a plurality of branch wirings coupled to the trunk wiring and receiving signals from the trunk wiring. Alternatively, when viewed from the normal direction of the substrate, the "other wiring" may be a wiring that extends so as to intersect with the trunk wiring and is electrically separated from the trunk wiring.

By forming the trunk wiring in a multilayer structure, the resistance of the trunk wiring can be reduced, so that the occurrence of the rounding of the signal waveform and the potential change as described above can be suppressed. By forming other wiring in a metal layer different from that of the trunk wiring, the trunk wiring and the other wiring can be formed without increasing the area of the region where the trunk wiring is formed.

First Embodiment

Hereinafter, the active matrix substrate according to the first embodiment will be described with reference to the drawings.

Figure 1:
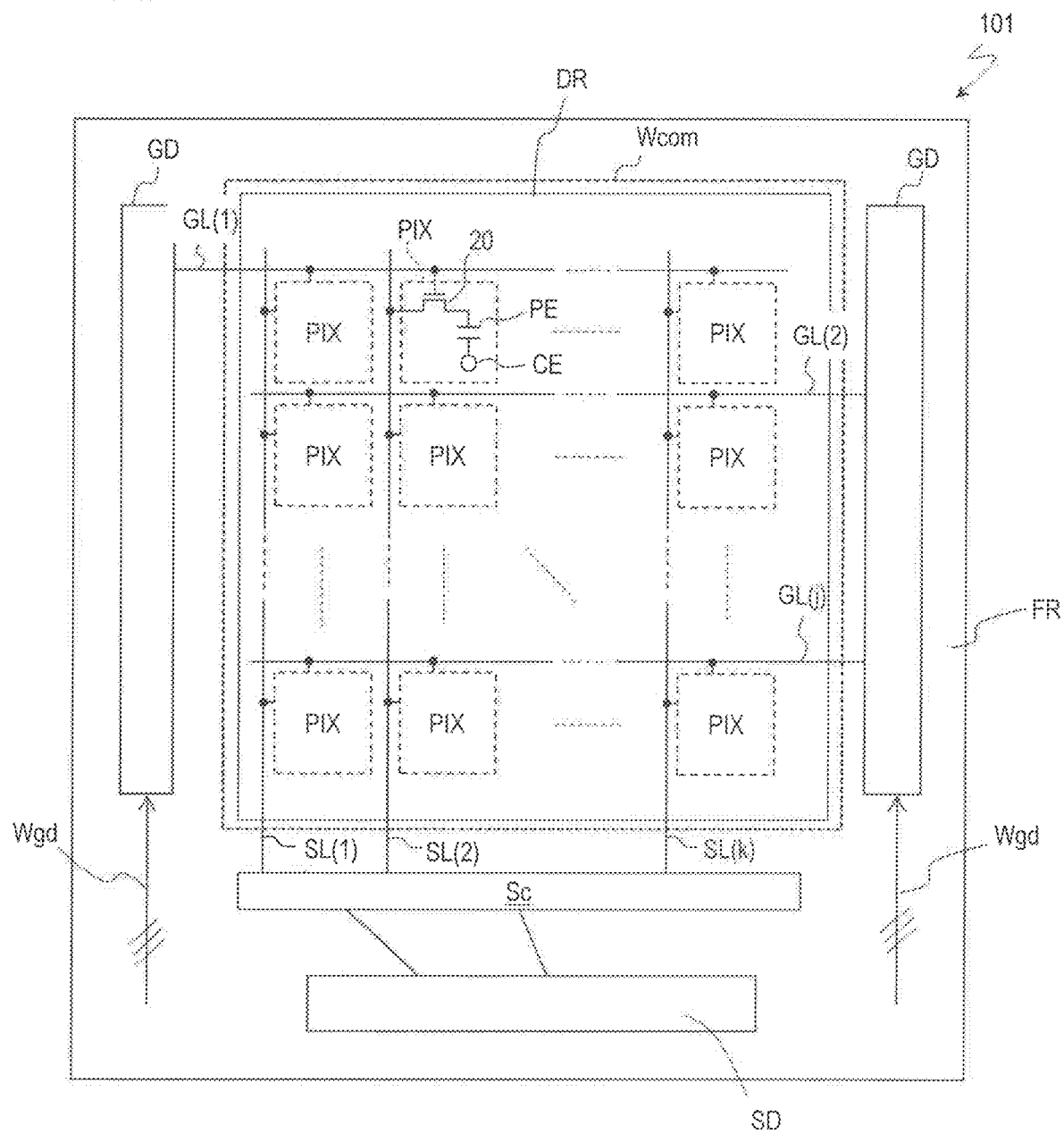
FIG. 1 is a schematic diagram illustrating an example of a planar structure of an active matrix substrate 101.

FIG. 1 is a diagram schematically illustrating an example of a planar structure of the active matrix substrate 101. The active matrix substrate 101 includes a display region DR contributing to display and a peripheral region (frame region) FR located outside the display region DR. The display region DR includes a plurality of pixel regions PIX arranged in a matrix. The pixel region PIX (simply, may be referred to as "pixel") is a region corresponding to a pixel of the display device. The non-display region FR is a region located around the display region DR and does not contribute to display.

In the display region DR, the active matrix substrate 101 is provided with a substrate 1, a plurality of pixel TFTs 20 supported by the substrate 1, a plurality of pixel electrodes PE, a plurality of gate bus lines GL(1) to GL(j) for supplying the gate signal to the pixel TFT 20 (j is an integer of 2 or more, and hereinafter, collectively referred to as "gate bus line GL"), and a plurality of source bus lines SL(1) to SL(k) for supplying the source signal to the pixel TFT 20 (k is an integer of 2 or more, and hereinafter, collectively referred to as "source bus line SL"). Each pixel region PIX is defined by, for example, the gate bus line GL and the source bus line SL. The source bus line SL extends in a direction intersecting with the gate bus line GL.

Each pixel TFT 20 and each pixel electrode PE are provided corresponding to one of the plurality of pixel regions PIX. The gate electrode of the pixel TFT 20 is electrically coupled to one of the gate bus lines GL, and the source electrode is electrically coupled to one of the source bus lines SL. The drain electrode is electrically coupled to the pixel electrode PE.

In a case where the active matrix substrate 101 is applied to a display device of a horizontal electric field mode such as a fringe field switching (FFS) mode, the active matrix substrate 101 is provided with a common electrode CE for a plurality of pixels PIX. The common electrode CE is coupled to the common signal trunk wiring Wcom.

In the non-display region FR, a peripheral circuit such as a driver can be provided. In this example, a gate driver GD for driving the gate bus line GL is provided integrally (monolithically) in the gate-side region FRg where the gate bus line GL extends in the non-display region FR.

A plurality of GDM signal trunk wirings Wgd are coupled to the gate driver GD. Although not illustrated, the GDM signal trunk wiring Wgd is coupled to a gate driver control unit, a power supply unit, and the like. Various signals such as the power supply voltage VSS and the clock signal CLK are input to the gate driver GD via these GDM signal trunk wirings Wgd.

An SSD circuit Sc for driving the source bus line SL in a time-division manner may be monolithically formed in the source-side region FRs where the source bus line SL extends in the non-display region FR. The SSD circuit Sc is coupled to a source driver SD implemented by, for example, a chip on glass (COG) method.

<Layer Structure of Active Matrix Substrate>

The active matrix substrate 101 has a lower source structure (that is, the source metal layer is located closer to the substrate side than the gate metal layer). The active matrix substrate 101 further is provided with a drain metal layer including a drain electrode separately from the source metal layer and the gate metal layer.

In this specification, on the substrate, a layer including an electrode and/or a wiring formed from the first conductive film is referred to as a "first metal layer M1", a layer disposed above the first metal layer M1 via an insulating layer and including an electrode and/or a wiring formed from the second conductive film is referred to as a "second metal layer M2", and a layer disposed above the second metal layer M2 via an insulating layer and including an electrode and/or a wiring formed from the third conductive film is referred to as a "third metal layer M3". One of these metal layers is a source metal layer, and the other is a gate metal layer. That is, of the source metal layer, the gate metal layer, and the other metal layer (for example, drain metal layer), the layer located closest to the substrate 1 side is the "first metal layer M1", the layer disposed on the first metal layer M1 via the insulating layer is the "second metal layer M2", and the layer disposed on the second metal layer M2 via the insulating layer is the "third metal layer M3". Therefore, in the active matrix substrate 101, the source metal layer is the "first metal layer M1", the gate metal layer is the "second metal layer M2", and the drain metal layer is the "third metal layer M3".

In this specification, a layer formed using the same conductive film (first transparent conductive film) as the pixel electrode PE is referred to as a "pixel electrode layer TP", and a layer formed using the same conductive film (second transparent conductive film) as the common electrode CE is referred to as a "common electrode layer TC".

In the drawings, the reference numeral of each component may be followed by parentheses to indicate the layer on which the component is formed. For example, an electrode or a wiring formed in the first metal layer M1 may be denoted by "(M1)" after the reference number.

<Pixel Region PIX>

Next, a structure of the pixel region PIX of the active matrix substrate of the present embodiment will be described using an active matrix substrate applied to an FFS mode display device as an example with reference to the drawings. The FFS mode is a lateral electric field mode in which a pair of electrodes is provided on one substrate and an electric field is applied to liquid crystal molecules in a direction (lateral direction) parallel to a substrate surface.

Figure 2A:
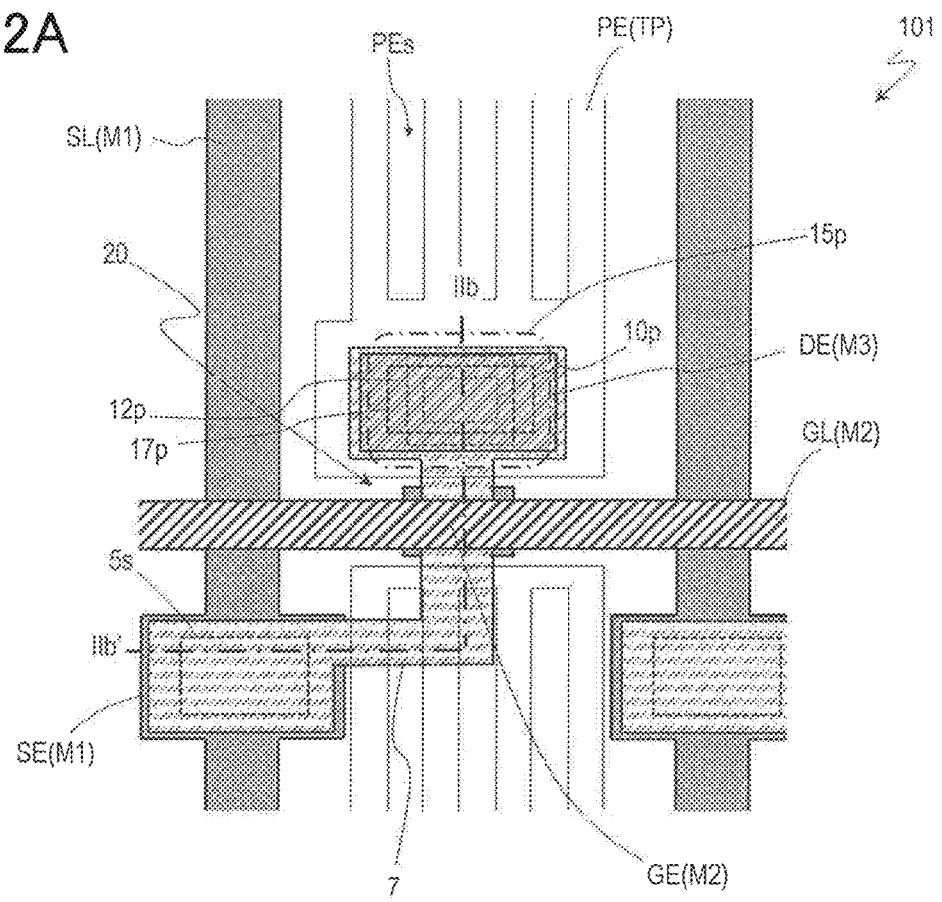
FIG. 2A is a plan view illustrating a pixel region in the active matrix substrate 101 according to a first embodiment.
Figure 2B:
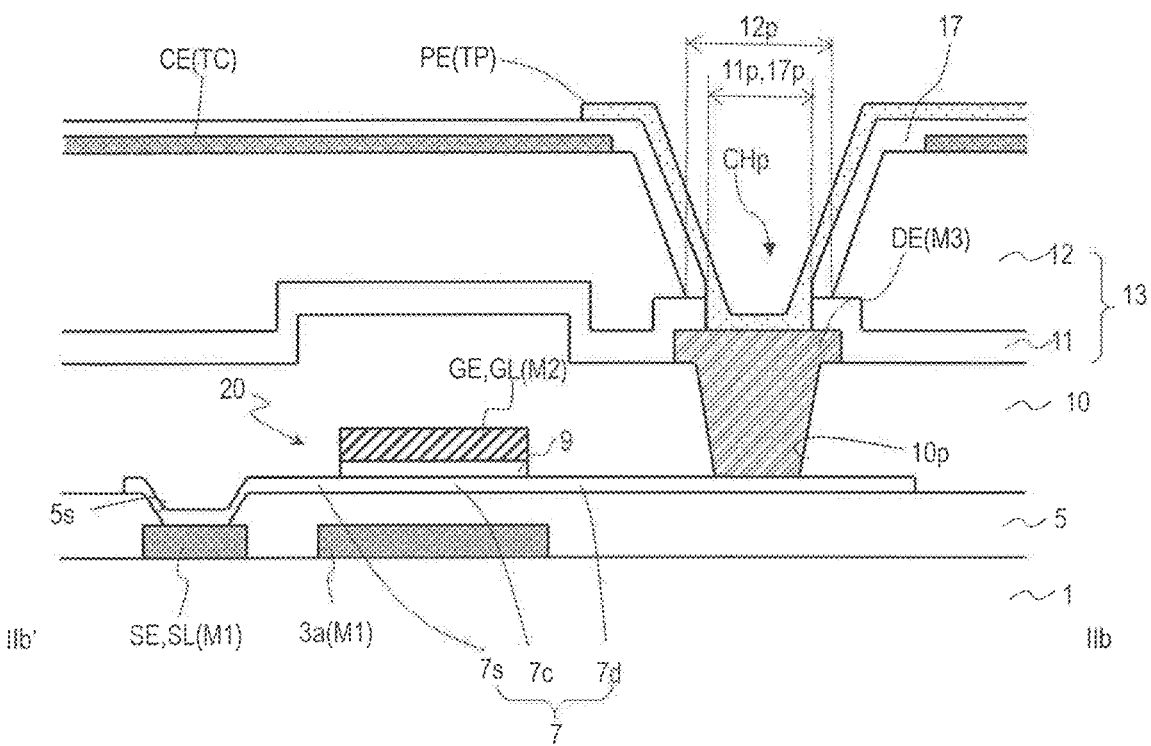
FIG. 2B is a cross-sectional view illustrating the pixel region in the active matrix substrate 101.

FIG. 2A is a plan view illustrating each pixel region PIX in the active matrix substrate 101, and FIG. 2B is a cross-sectional view taken along line IIb-IIb' across the TFT 20 in the pixel region PIX.

The active matrix substrate 101 includes a substrate 1 and a plurality of source bus lines SL and a plurality of gate bus lines GL supported on a main surface of the substrate 1. Each pixel region PIX is defined by one source bus line SL and one gate bus line GL. Each pixel region PIX has a top gate type TFT 20, a pixel electrode PE, and a common electrode CE.

As illustrated in FIG. 2B, the active matrix substrate 101 includes a first metal layer M1 including the source bus line SL, a lower insulating layer 5 covering the first metal layer M1, an oxide semiconductor layer 7, a gate insulating layer 9, a second metal layer M2 including the gate bus line GL, an interlayer insulating layer 10 covering the second metal layer M2, a third metal layer M3 including the drain electrode DE, and an upper insulating layer 13 covering the third metal layer M3 in this order, from the substrate 1 side. A common electrode layer TC including the common electrode CE, a dielectric layer 17, and a pixel electrode layer TP including the pixel electrode PE are formed in this order on the upper insulating layer 13.

The TFT 20 is provided with an oxide semiconductor layer 7 provided on the lower insulating layer 5 and a gate electrode GE provided on a portion of the oxide semiconductor layer 7 via the gate insulating layer 9.

The oxide semiconductor layer 7 includes a channel region 7c, and a first region 7s and a second region 7d disposed on both sides thereof, respectively. The first region 7s and the second region 7d are low-resistance regions having a lower specific resistance than the channel region 7c. The gate electrode GE is disposed so as to overlap the channel region 7c when viewed from the normal direction of the main surface of the substrate 1 (hereinafter, abbreviated as "normal direction of the substrate 1"). The gate insulating layer 9 may cover the channel region 7c and may not cover the first region 7s and the second region 7d.

The oxide semiconductor layer 7 is disposed on the lower insulating layer 5 and in a source opening portion 5s formed in the lower insulating layer 5. The first region 7s of the oxide semiconductor layer 7 is electrically coupled to the corresponding source bus line SL in the source opening portion 5s.

The first region 7s may be electrically coupled to the source bus line SL via the source electrode SE. The source electrode SE may be formed in the first metal layer M1, and may be coupled to (integrally formed with) the source bus line SL. For example, when viewed from the normal direction of the substrate 1, the source electrode SE may be formed in an extended portion or a protruding portion (branch portion) extending from a portion of the side surface of the source bus line SL extending in the first direction in another direction. The source electrode SE may be a portion of the source bus line SL. In such a case, a portion of the source bus line SL coupled to the first region 7s may be referred to as a "source electrode SE". In this example, the first region 7s of the oxide semiconductor layer 7 extends so as to overlap a portion of the source bus line SL when viewed from the normal direction of the substrate 1. The lower surface of the first region 7s is in direct contact with the source electrode SE which is a portion of the source bus line SL in the source opening portion 5s.

The gate electrode GE of the TFT 20 is electrically coupled to a corresponding gate bus line GL. The gate electrode GE is formed in the second metal layer M2. The gate electrode GE may be coupled to the gate bus line GL. For example, when viewed from the normal direction of the substrate 1, the gate electrode GE may be formed in an extended portion or a protruding portion (branch portion) extending from a portion of the side surface of the gate bus line GL extending in the second direction in another direction. Alternatively, the gate electrode GE may be a portion of the gate bus line GL. In this case, a portion of the gate bus line GL that overlaps the oxide semiconductor layer 7 when viewed from the normal direction of the substrate 1 may be referred to as a "gate electrode GE".

The TFT 20 may have a light shielding layer 3a on the substrate 1 side of the oxide semiconductor layer 7. The light shielding layer 3a is formed in the first metal layer M1. The light shielding layer 3a may be disposed so as to overlap at least the channel region 7c in the oxide semiconductor layer 7 when viewed from the normal direction of the substrate 1. As a result, deterioration of characteristics of the oxide semiconductor layer 7 due to light (backlight light) from the substrate 1 side can be suppressed.

The interlayer insulating layer 10 is formed so as to cover the oxide semiconductor layer 7, the gate insulating layer 9, and the second metal layer M2 (gate metal layer). The interlayer insulating layer 10 may be in contact with the first region 7s and the second region 7d of the oxide semiconductor layer 7. As the interlayer insulating layer 10, a reducing insulating film (for example, silicon nitride film) that can reduce an oxide semiconductor may be used. In this case, the specific resistance of a portion (first region 7s and second region 7d) of oxide semiconductor layer 7 in contact with the interlayer insulating layer 10 can be lower than that of a portion (channel region 7c) not in contact with the interlayer insulating layer 10.

A third metal layer M3 including the drain electrode DE of the TFT 20 is formed on the interlayer insulating layer 10. The drain electrode DE is disposed on the interlayer insulating layer 10 and in the drain opening portion 10p provided in the interlayer insulating layer 10, and is coupled to the second region 7d of the oxide semiconductor layer 7 in the drain opening portion 10p. The drain electrode DE is electrically coupled to the pixel electrode PE.

An upper insulating layer 13 is formed on the third metal layer M3 so as to cover the TFT 20. The upper insulating layer 13 includes, for example, an inorganic insulating layer (passivation film) 11. As illustrated in the drawing, the upper insulating layer 13 may have a laminated structure including the inorganic insulating layer 11 and an organic insulating layer 12 formed on the inorganic insulating layer 11. The organic insulating layer 12 may not be formed. Alternatively, the organic insulating layer 12 may be formed only in the display region.

On the upper insulating layer 13, a common electrode CE is formed. The common electrode CE may not be separated for each pixel region PIX. For example, the common electrode CE may have an opening portion 15p in a region (pixel contact region) where the pixel contact hole CHp is formed, and may be formed over the entire pixel region PIX except for the pixel contact region.

The pixel electrode PE is disposed on the common electrode CE via the dielectric layer 17. The pixel electrode PE is separated for each pixel region PIX. In each pixel region PIX, the pixel electrode PE is provided with one or a plurality of slits (opening portions) PEs or cutout portions.

The pixel electrode PE is disposed on the dielectric layer 17 and is coupled to the second region 7d of the oxide semiconductor layer 7 in the pixel contact hole CHp formed in the upper insulating layer 13 and the dielectric layer 17. In this example, the pixel contact hole CHp is configured to include an opening portion 11p of the inorganic insulating layer 11, an opening portion 12p of the organic insulating layer 12, and an opening portion 17p of the dielectric layer 17.

Although the pixel electrode layer TP is formed on the common electrode layer TC via the dielectric layer 17 in the illustrated example, the common electrode layer TC may be formed on the pixel electrode layer TP via the dielectric layer 17.

<GDM Signal Trunk Wiring Forming Region 202>

Next, a structure of the trunk wiring in the present embodiment will be described using the GDM signal trunk wiring Wgd as an example.

As described above, the active matrix substrate 101 includes three metal layers of the first metal layer M1, the second metal layer M2, and the third metal layer M3. In this example, these metal layers M1 to M3 are provided closer to the substrate 1 than the upper insulating layer 13, the pixel electrode layer TP, and the common electrode layer TC. Each of these metal layers M1 to M3 may include, for example, a low-resistance metal layer such as a Cu layer or an Al layer.

In the present embodiment, the GDM signal trunk wiring Wgd and other wiring (here, branch wiring B) coupled to the GDM signal trunk wiring Wgd are formed using three metal layers M1 to M3. The GDM signal trunk wiring Wgd having a multilayer structure is formed by two metal layers of the first to third metal layers M1 to M3, and the branch wiring B is formed by another metal layer.

Figure 3A:
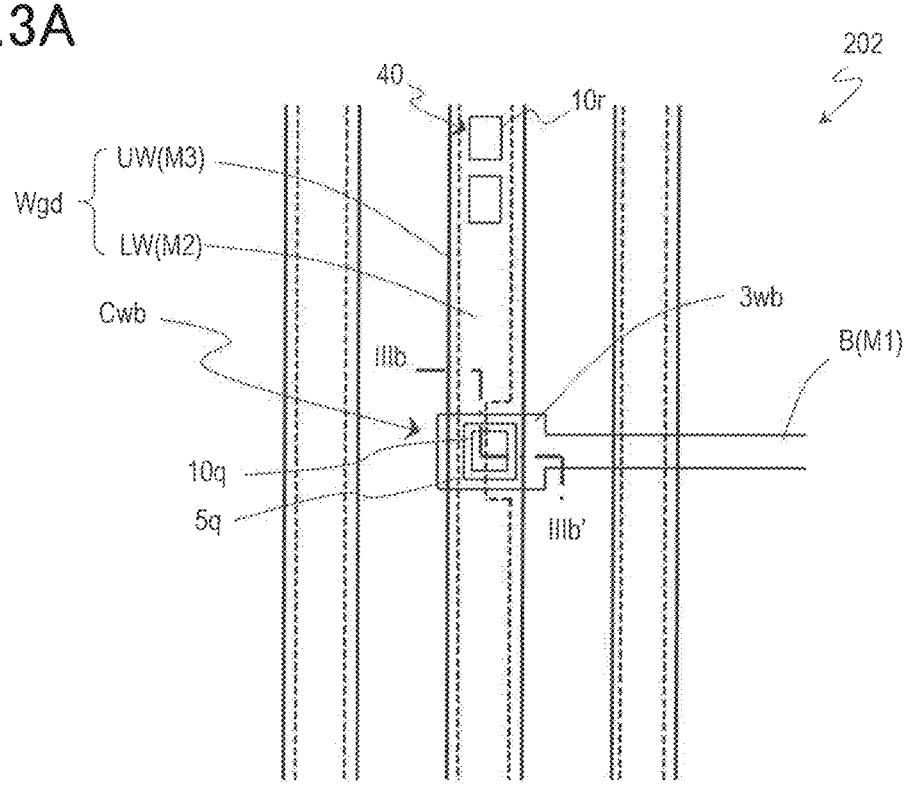
FIG. 3A is a plan view illustrating a GDM signal trunk wiring forming region 202 in the active matrix substrate 101.
Figure 3B:
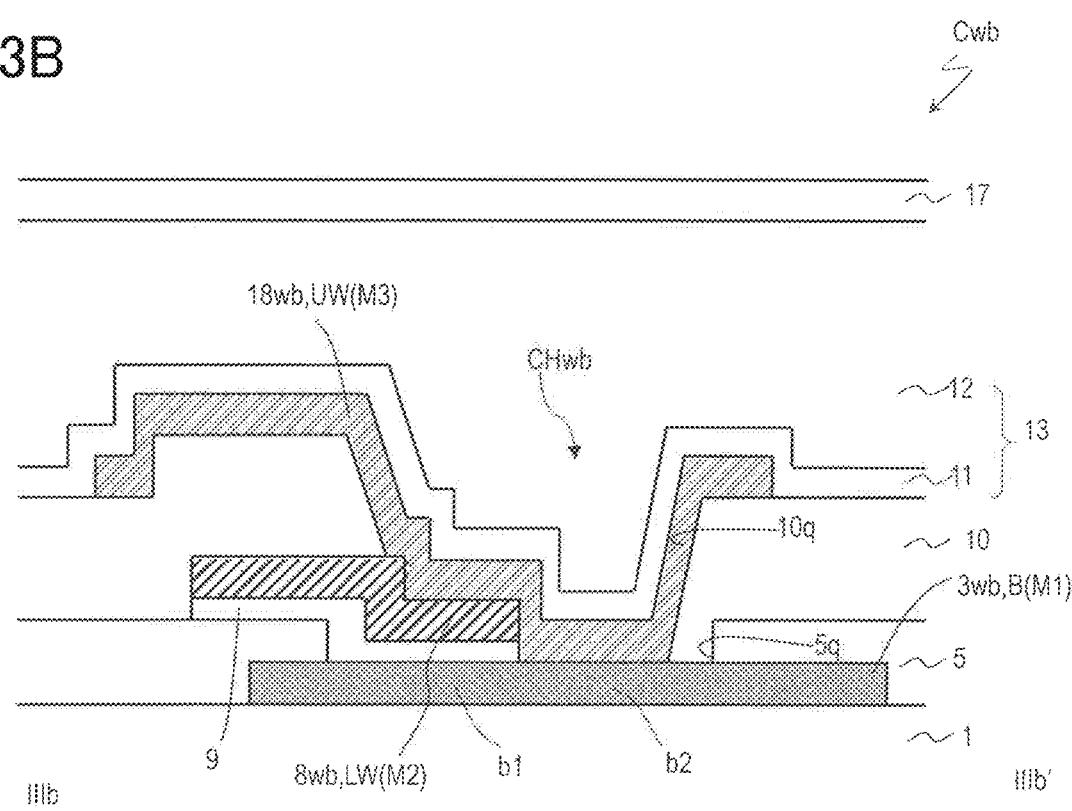
FIG. 3B is a cross-sectional view of a trunk wiring coupling portion Cwb in the GDM signal trunk wiring forming region 202.

FIG. 3A is a plan view illustrating a portion of the GDM signal trunk wiring forming region 202 in the non-display region, and illustrates the GDM signal trunk wiring Wgd, the branch wiring B, and the trunk wiring coupling portion Cwb coupling the GDM signal trunk wiring Wgd and the branch wiring B. FIG. 3B is a cross-sectional view taken along line nib-IIIb' across the trunk wiring coupling portion Cwb.

The GDM signal trunk wiring Wgd has a multilayer structure including a lower wiring LW and an upper wiring UW disposed on the lower wiring LW via an insulating layer. The lower wiring LW is formed in one metal layer of the first to third metal layers M1 to M3, and the upper wiring UW is formed in another metal layer. The branch wiring B is formed in the remaining one metal layer of the first to third metal layers M1 to M3 (neither the upper wiring UW nor the lower wiring LW is formed).

The GDM signal trunk wiring Wgd is electrically coupled to the plurality of branch wirings B. The coupling portion Cwb coupling each branch wiring B and the GDM signal trunk wiring Wgd is referred to as a "trunk wiring coupling portion". In the trunk wiring coupling portion Cwb, at least one of the upper wiring UW and the lower wiring LW of the GDM signal trunk wiring Wgd may be in contact with the branch wiring B.

In the example illustrated in FIGS. 3A and 3B, the lower wiring LW is formed in the second metal layer M2 (in the gate metal layer in this example), the upper wiring UW is formed in the third metal layer M3 (in the drain metal layer in this example), and the branch wiring B is formed in the first metal layer M1 (in the source metal layer in this example). The upper wiring UW is disposed on the lower wiring LW via the interlayer insulating layer 10. The branch wiring B is located closer to the substrate 1 than the GDM signal trunk wiring Wgd.

In FIG. 3A, although the width of the upper wiring UW is larger than that of the lower wiring LW, the width of the lower wiring LW may be larger, or these widths may be substantially equal. In the illustrated example, the upper wiring UW is disposed so as to cover the entire lower wiring LW when viewed from the normal direction of the substrate 1, and the upper wiring UW and the lower wiring LW may overlap at least partially when viewed from the normal direction of the substrate 1.

Each branch wiring B extends from one bistable circuit (not illustrated) of the shift register to a corresponding trunk wiring W. When viewed from the normal direction of the substrate 1, a portion of the branch wiring B (end portion of the branch wiring B in this example) overlaps the corresponding GDM signal trunk wiring Wgd in the trunk wiring coupling portion Cwb.

In the present specification, in the trunk wiring coupling portion Cwb, a coupling portion of each wiring formed in the first metal layer M1, the second metal layer M2, and the third metal layer M3 (portion of each wiring located at the trunk wiring coupling portion Cwb) are referred to as a "first coupling layer", a "second coupling layer", and a "third coupling layer", respectively. In this example, the coupling portion 3wb of the branch wiring B formed in the first metal layer M1 is the "first coupling layer", and the coupling portion 8wb of the lower wiring LW formed in the second metal layer M2 is the "second coupling layer", and the coupling portion 18wb of the upper wiring UW formed in the third metal layer M3 is the "third coupling layer".

In the trunk wiring coupling portion Cwb, a first opening portion 5q exposing a portion of the first coupling layer 3wb is formed in the lower insulating layer 5 extending on the first coupling layer 3wb (here, end portion of the branch wiring B). The second coupling layer 8wb (here, a portion of the lower wiring LW) is disposed on a portion (first portion) b1 of the exposed portion of the first coupling layer 3wb via the gate insulating layer 9. The lower wiring LW covers only the first portion b1 of the exposed portion of the first coupling layer 3wb when viewed from the normal direction of the substrate 1. The interlayer insulating layer 10 extends on the second coupling layer 8wb, and a second opening portion 10q exposing a portion of the second coupling layer 8wb and another portion (second portion) b2 of the exposed portion of the first coupling layer 3wb is formed in the interlayer insulating layer 10. The second opening portion 10q and the first opening portion 5q at least partially overlap to form a contact hole CHwb. The third coupling layer 18wb (here, a portion of the upper wiring UW) is disposed on the interlayer insulating layer 10 and in the second opening portion 10q. The third coupling layer 18wb is coupled to (here, directly in contact with) the second coupling layer 8wb and the second portion b2 of the first coupling layer 3wb in the contact hole CHwb. An insulating layer (here, the upper insulating layer 13 and the dielectric layer 17) extends on the third coupling layer 18wb. The organic insulating layer 12 of the upper insulating layer 13 may not be extended.

As described above, by disposing the third coupling layer 18wb so as to be in contact with both the first coupling layer 3wb and the second coupling layer 8wb, the GDM signal trunk wiring Wgd can be coupled to the branch wiring B in the trunk wiring coupling portion Cwb, and the upper wiring UW and the lower wiring LW can be electrically coupled to each other.

As illustrated in the drawing, one or a plurality of contact units 40 for electrically coupling the upper wiring UW and the lower wiring LW may be provided in a region other than the region where the trunk wiring coupling portion Cwb is formed in the GDM signal trunk wiring Wgd. In the contact unit 40, the interlayer insulating layer 10 has an opening portion 10r exposing a portion of the lower wiring LW, and the upper wiring UW is disposed so as to be directly in contact with the lower wiring LW in the opening portion 10r.

Figure 4A:
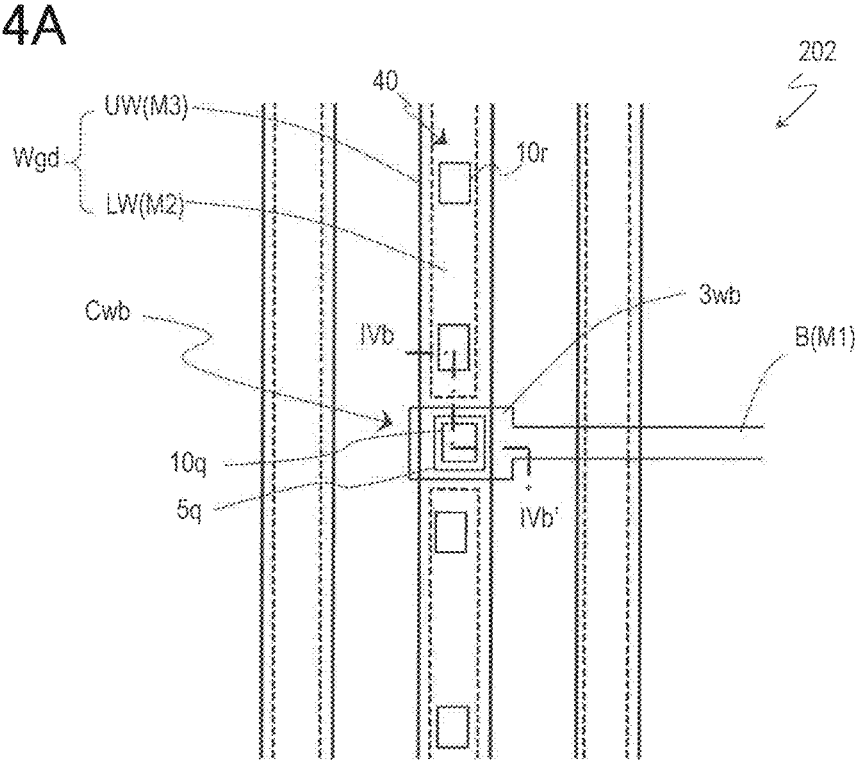
FIG. 4A is a plan view illustrating another GDM signal trunk wiring forming region 202.
Figure 4B:
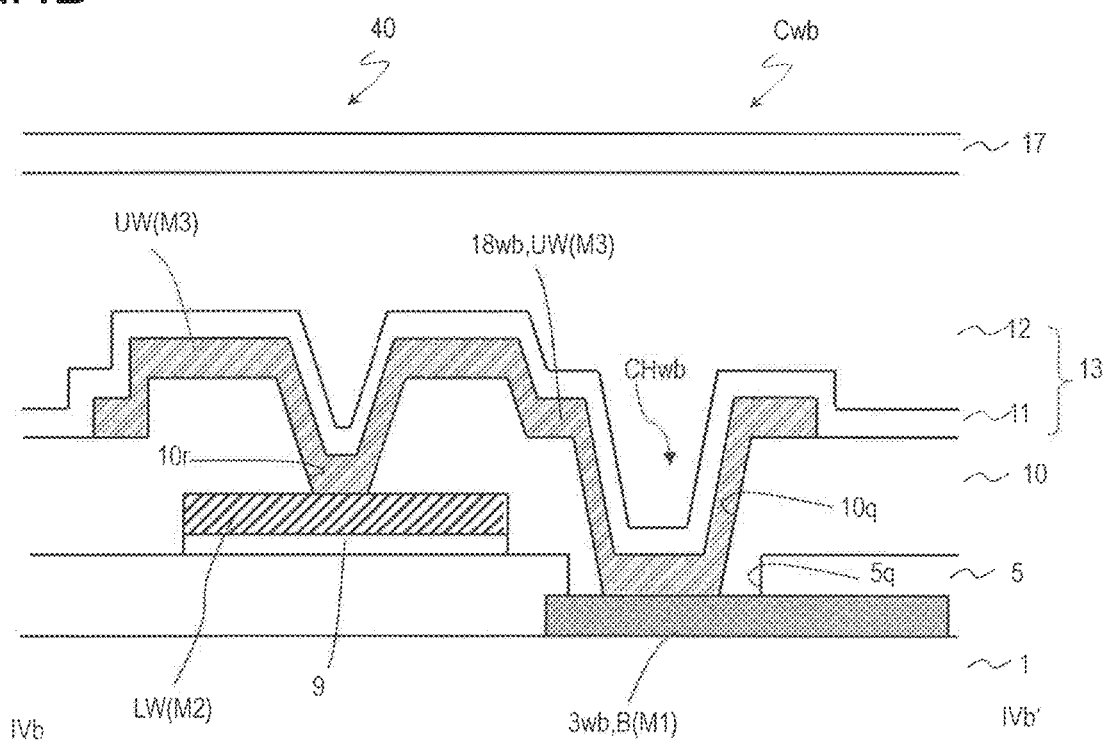
FIG. 4B is a cross-sectional view of a trunk wiring coupling portion Cwb in another GDM signal trunk wiring forming region 202.

In a case where the contact unit 40 is provided, the upper wiring UW may be disposed so as to be in contact with the entire exposed portion of the branch wiring B in the contact hole CHwb in the trunk wiring coupling portion Cwb, and only the upper wiring UW may be coupled to the branch wiring B. In this case, as illustrated in FIGS. 4A and 4B, the gate insulating layer 9 and the lower wiring LW may be patterned so as not to overlap the exposed portion of the first coupling layer 3wb (branch wiring B in this case). The lower wiring LW may be separated so as not to overlap the trunk wiring coupling portion Cwb when viewed from the normal direction of the substrate 1. Each separated portion of the lower wiring LW may be electrically coupled to the upper wiring UW by the contact unit 40 formed in a region different from the trunk wiring coupling portion Cwb.

In the above description, the example of forming the GDM signal trunk wiring Wgd using the second metal layer M2 and the third metal layer M3 is described, and the GDM signal trunk wiring Wgd may be formed using another two metal layers.

Figure 5A:
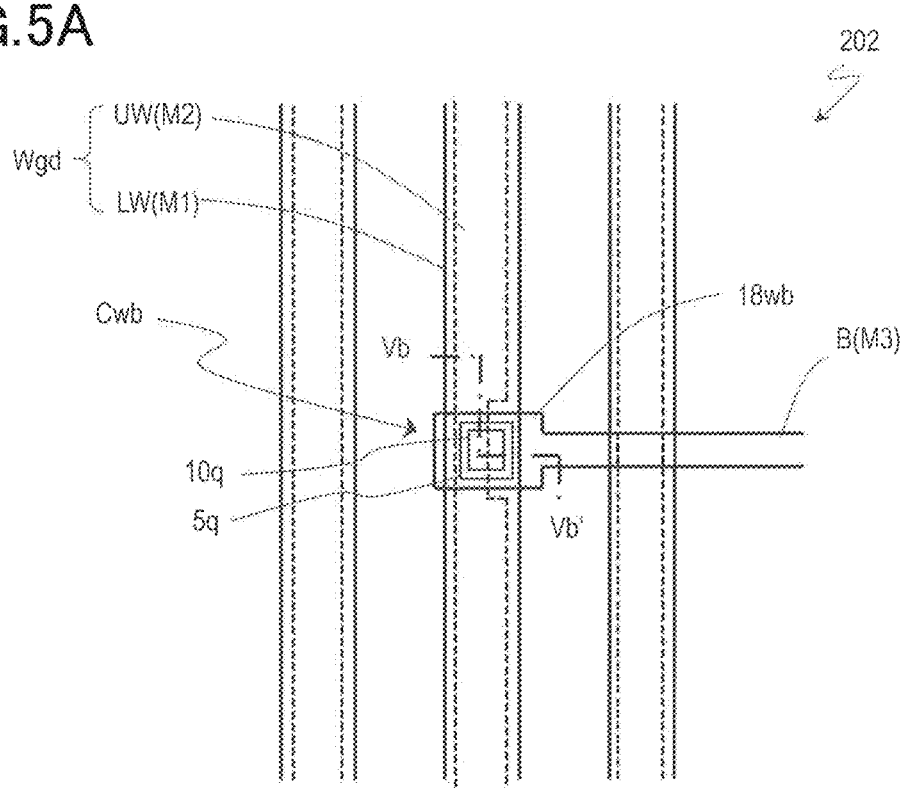
FIG. 5A is a plan view illustrating still another GDM signal trunk wiring forming region 202.
Figure 5B:
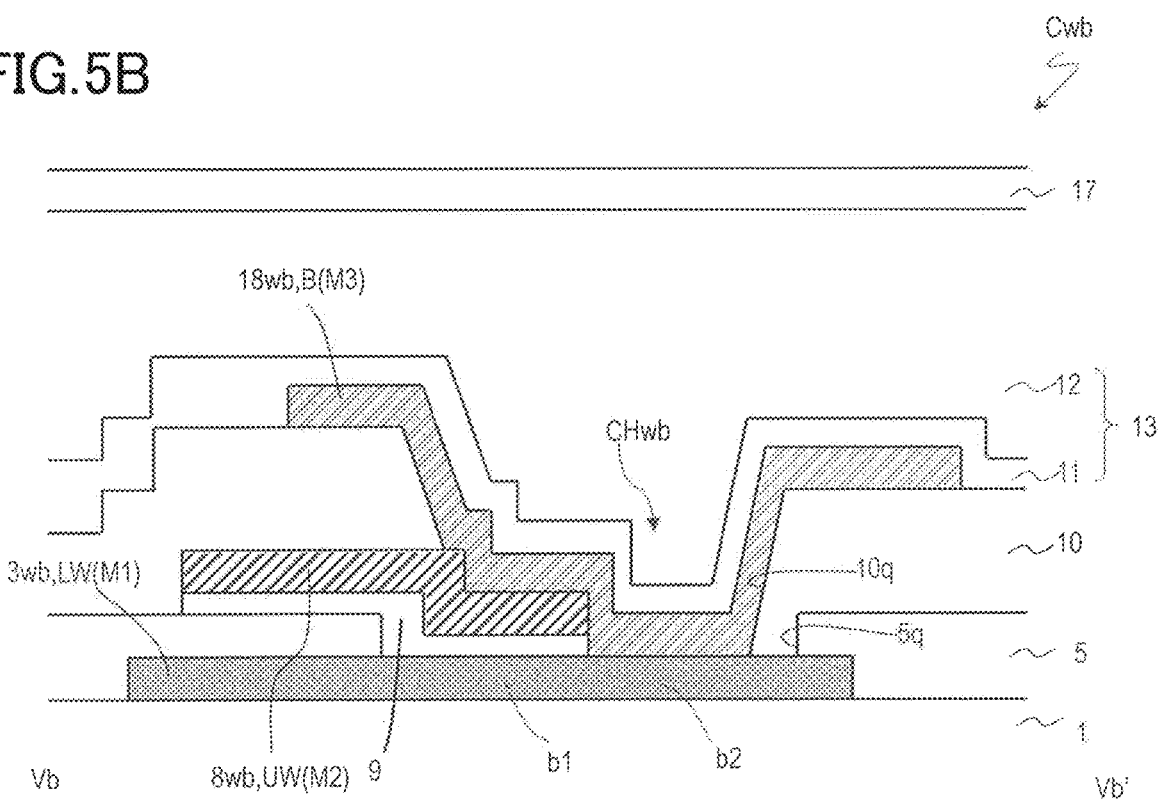
FIG. 5B is a cross-sectional view of a trunk wiring coupling portion Cwb in still another GDM signal trunk wiring forming region 202.

FIGS. 5A and 5B are a plan view and a cross-sectional view, respectively, illustrating another example of the GDM signal trunk wiring Wgd and the trunk wiring coupling portion Cwb.

In this example, the GDM signal trunk wiring Wgd is formed using the first metal layer M1 (source metal layer in this example) and the second metal layer M2 (gate metal layer in this example), and the branch wiring B is formed using the third metal layer M3 drain metal layer in this example). That is, the branch wiring B is located above the GDM signal trunk wiring Wgd.

The GDM signal trunk wiring Wgd includes a lower wiring LW in the first metal layer M1 and an upper wiring UW in the second metal layer M2. The upper wiring UW is disposed on the lower wiring LW via the lower insulating layer 5 and the gate insulating layer 9.

In the trunk wiring coupling portion Cwb, the branch wiring B, the lower wiring LW, and the upper wiring UW are electrically coupled to each other. A structure of the trunk wiring coupling portion Cwb is the same as the structure described with reference to FIG. 3B. However, the coupling portion 3wb of the lower wiring LW formed in the first metal layer M1 is the "first coupling layer", the coupling portion 8wb of the upper wiring UW formed in the second metal layer M2 is the "second coupling layer", and the coupling portion (end portion) 18wb of the branch wiring B formed in the third metal layer M3 is the "third coupling layer".

Figure 6A:
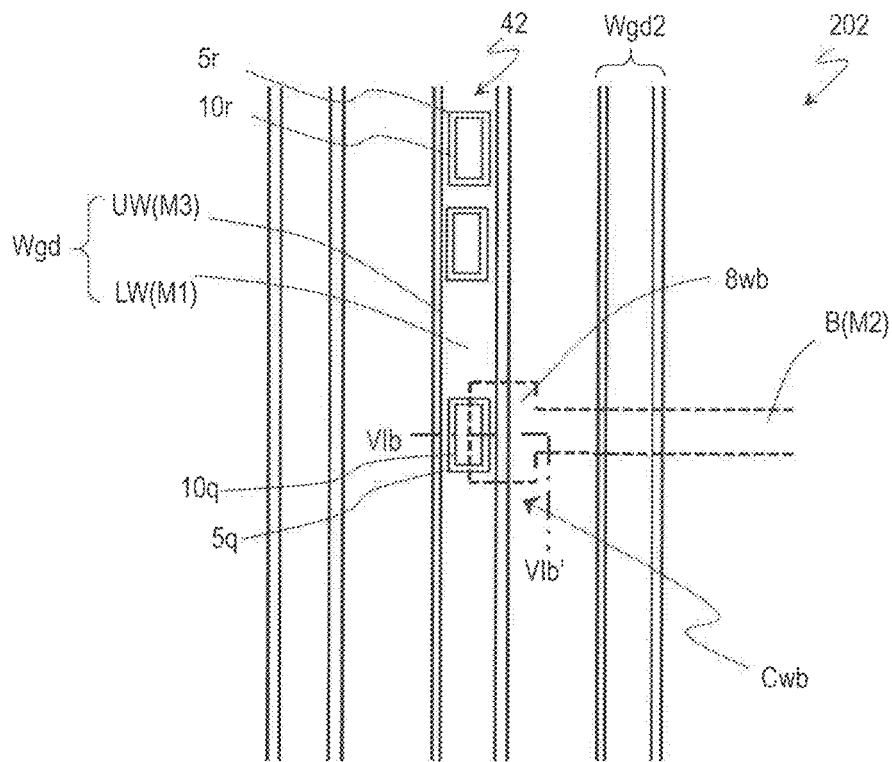
FIG. 6A is a plan view illustrating still another GDM signal trunk wiring forming region 202.
Figure 6B:
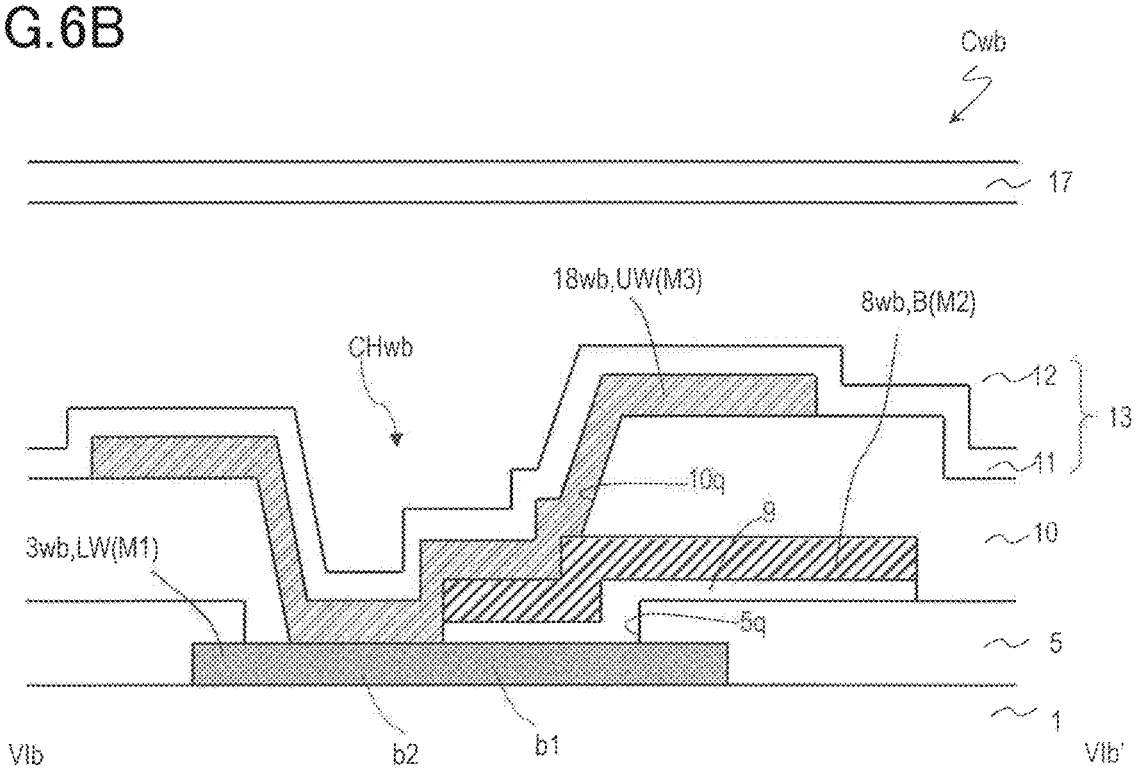
FIG. 6B is a cross-sectional view of a trunk wiring coupling portion Cwb in still another GDM signal trunk wiring forming region 202.

FIGS. 6A and 6B are a plan view and a cross-sectional view, respectively, illustrating another example of the GDM signal trunk wiring Wgd and the trunk wiring coupling portion Cwb.

In this example, the GDM signal trunk wiring Wgd is formed using the first metal layer M1 and the third metal layer M3, and the branch wiring B is formed using the second metal layer M2. That is, the branch wiring B is located between the two metal layers forming the GDM signal trunk wiring Wgd.

The GDM signal trunk wiring Wgd includes a lower wiring LW in the first metal layer M1 and an upper wiring UW in the third metal layer M3. The upper wiring UW is disposed on the lower wiring LW via the lower insulating layer 5 and the interlayer insulating layer 10.

In the trunk wiring coupling portion Cwb, the branch wiring B, the lower wiring LW, and the upper wiring UW are electrically coupled to each other. A structure of the trunk wiring coupling portion Cwb is the same as the structure described with reference to FIG. 3B. However, the coupling portion 3wb of the lower wiring LW formed in the first metal layer M1 is the "first coupling layer", the coupling portion 8wb of the branch wiring B formed in the second metal layer M2 is the "second coupling layer", and the coupling portion (end portion) 18wb of the upper wiring UW formed in the third metal layer M3 is the "third coupling layer".

As illustrated in the drawing, one or a plurality of contact units 42 for electrically coupling the upper wiring UW and the lower wiring LW may be provided in a region other than the region where the trunk wiring coupling portion Cwb is formed in the GDM signal trunk wiring Wgd. In the contact unit 42, the upper wiring UW is in direct contact with the lower wiring LW in the opening portion 5r formed in the lower insulating layer 5 and the opening portion 10r formed in the interlayer insulating layer 10.

As described above, in the configuration in which the branch wiring B is formed using the second metal layer M2, the branch wiring B extends toward the corresponding GDM signal trunk wiring Wgd across a portion between the lower wiring LW and upper wiring UW in another GDM signal trunk wiring Wgd2. Therefore, there is a possibility that the parasitic capacitance between the branch wiring B and another GDM signal trunk wiring Wgd2 increases.

Figure 7:
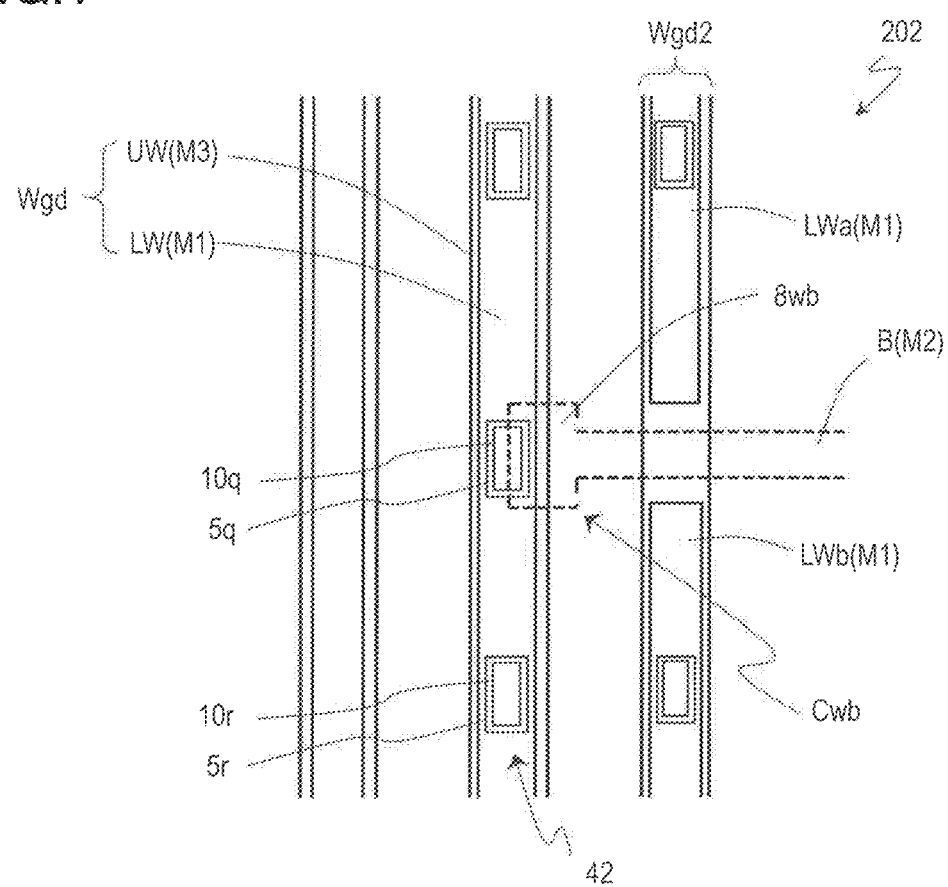
FIG. 7 is a plan view illustrating still another GDM signal trunk wiring forming region 202.

In order to reduce the parasitic capacitance generated at an intersection portion between the branch wiring B and another GDM signal trunk wiring Wgd2, as illustrated in FIG. 7, a cutout portion may be provided in the lower wiring LW or the upper wiring UW of another GDM signal trunk wiring Wgd2 at the intersection portion. In the example illustrated in FIG. 7, the cutout portion is provided in the lower wiring LW. The lower wiring LW may be separated into two portions LWa and LWb so as not to overlap the branch wiring B. In this case, only the upper wiring UW of the GDM signal trunk wiring Wgd overlaps the branch wiring B at the intersection portion. As described above, the GDM signal trunk wiring Wgd may partially have a single layer structure. Although not illustrated, a cutout portion may be provided in the upper wiring UW instead of the lower wiring LW.

In the example described above with reference to FIGS. 3A to 7, all of the plurality of GDM signal trunk wirings Wgd have a multilayer structure, and in the present embodiment, at least one GDM signal trunk wiring Wgd may have a multilayer structure. For example, the clock signal trunk wiring W (CLK) for transmitting the clock signal is formed in a multilayer structure, so that occurrence of rounding in the clock signal can be suppressed. Alternatively, the VSS signal trunk wiring W (VSS) for transmitting the power supply voltage signal VSS is formed in a multilayer structure, so that a potential change of the VSS signal can be suppressed.

The GDM signal trunk wiring Wgd may be formed in a multilayer structure as a whole or partially in a multilayer structure. For example, the GDM signal trunk wiring Wgd may include a portion having a single layer structure and a portion having a multilayer structure, as illustrated in FIGS. 4A and 7.

In an active matrix substrate in the related art using a top gate type TFT or a bottom gate type TFT as a pixel TFT, the conductive layer is formed of a source metal layer and a gate metal layer, except for a transparent conductive layer such as a pixel electrode layer and a common electrode layer. In a lower source structure substrate in the related art (for example, International Application Publication No. WO2015/186619), the conductive layer is formed of a gate metal layer and a source metal layer provided on the substrate side, except for a transparent conductive layer such as a pixel electrode layer and a common electrode layer. Therefore, it was required to form the GDM signal trunk wiring on only any one of the gate metal layer and the source metal layer, and to form another wiring such as a branch wiring on the other metal layer.

On the other hand, in the present embodiment, another metal layer (here, drain metal layer) is further provided between the substrate 1 and the electrode layers TP and TC formed of the transparent conductive films. Therefore, by using these three metal layers (the first metal layer M1, the second metal layer M2, and the third metal layer M3 from the substrate 1 side), a GDM signal trunk wiring having a multilayer structure and a branch wiring coupled to the GDM signal trunk wiring can be formed. As a result, the resistance of the GDM signal trunk wiring can be reduced, so that the rounding of the GDM signal and the potential change can be reduced. By reducing the rounding of the clock signal CLK input to each stage of the shift register, it is possible to reduce the rounding of the gate signal output from each stage of the shift register. As a result, the resistance distribution in the plane of the substrate 1 can be reduced, and a longer pixel charging time can be secured. Furthermore, it can contribute to a reduction in the size of a TFT (referred to as a "circuit TFT") constituting the gate driver GD.

By forming the GDM signal trunk wiring in a multilayer structure, even in a case where one of the lower wiring LW and the upper wiring UW is broken, the other can be compensated, so that the reliability can be improved.

Each of the first metal layer M1 to the third metal layer M3 may be, for example, a metal layer (including an alloy layer) containing a low-resistance metal material (for example, Cu, Al, or the like). Alternatively, a laminated structure having such a metal layer as the uppermost layer may be provided.

The structure of the GDM signal trunk wiring Wgd in the present embodiment is suitably applied to the active matrix substrate having a large load on the GDM signal trunk wiring Wgd. The active matrix substrate of the present embodiment can be suitably used for, for example, a large-sized display, a high-definition display, or a display in which the pixel charging time is shortened by high-definition, high-frequency driving, SSD mounting, or the like.

The specific configuration of the gate driver is not particularly limited, and may have various known configurations. As the configuration of the gate driver, for example, the disclosure contents of International Application Publication No. WO2011/024499 and International Application Publication No. WO2014/069279 are incorporated herein by reference.

<Common Signal Trunk Wiring Wcom>

The trunk wiring to which the multilayer structure is applied is not limited to the GDM signal trunk wiring Wgd. For example, the active matrix substrate 101 may be provided with a common signal trunk wiring Wcom having a multilayer structure.

Figure 8A:
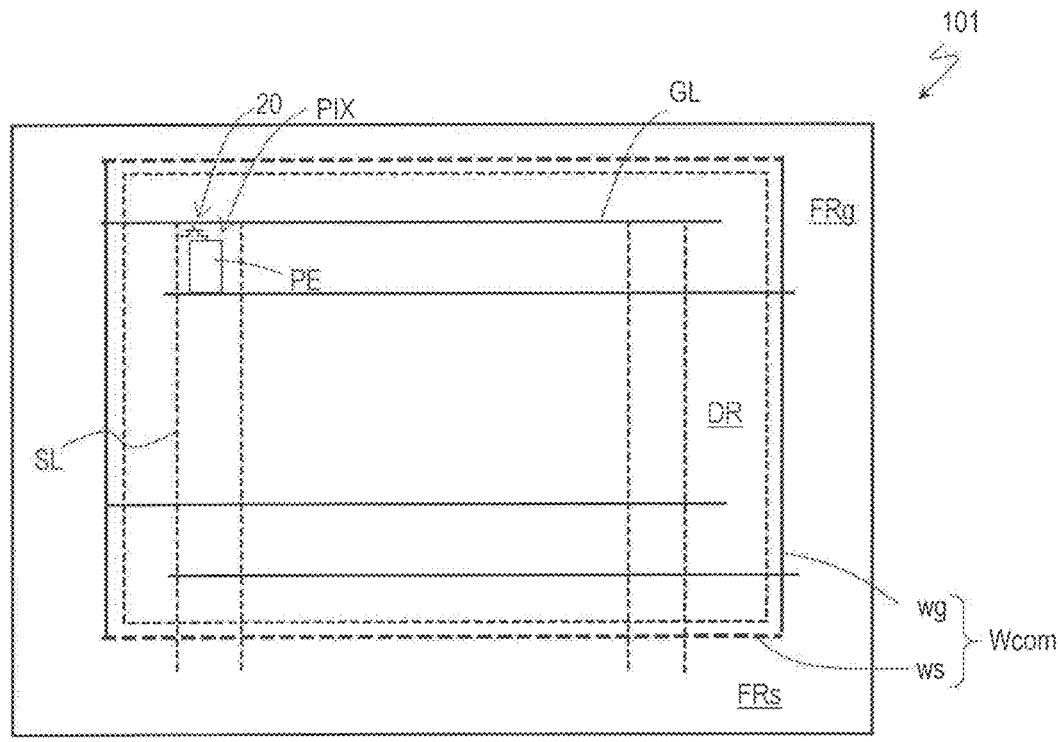
FIG. 8A is a plan view schematically illustrating the active matrix substrate 101.
Figure 8B:
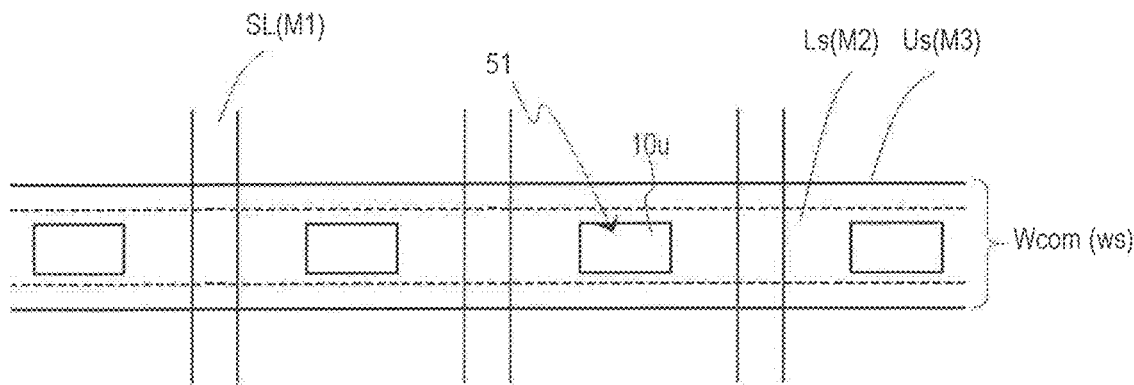
FIG. 8B is a plan view of a first wiring unit ws of a common signal trunk wiring Wcom.
Figure 8C:
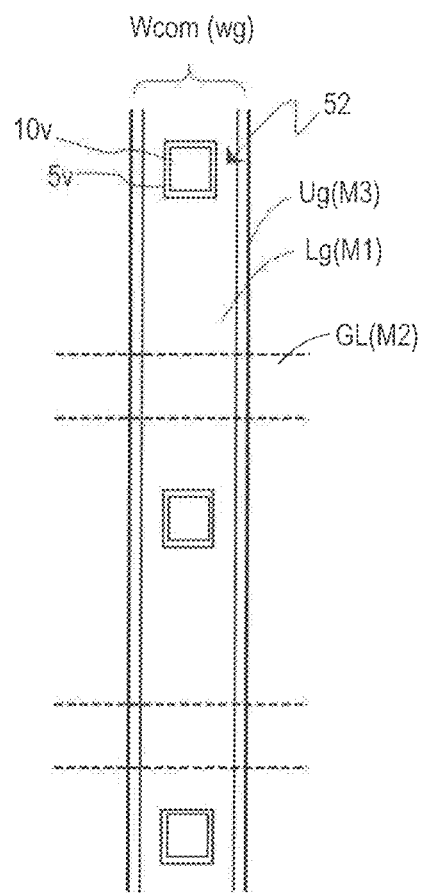
FIG. 8C is a plan view of a second wiring unit wg of the common signal trunk wiring Wcom.

FIG. 8A is a plan view schematically illustrating the active matrix substrate 101. FIG. 8B is a plan view of a portion (first wiring unit) ws of the common signal trunk wiring Wcom located in the source-side region FRs of the non-display region FR, and FIG. 8C is a plan view of a portion (second wiring unit) wg of the common signal trunk wiring Wcom located in the gate-side region FRg of the non-display region FR.

As illustrated in FIG. 8A, the common signal trunk wiring Wcom is provided so as to surround the display region DR. The first wiring unit ws of the common signal trunk wiring Wcom located in the source-side region FRs extends in the same direction as the gate bus line GL (second direction), for example, so as to intersect with the plurality of source bus lines SL. The second wiring unit wg of the common signal trunk wiring Wcom located in the gate-side region FRg extends in the same direction as the source bus line SL (first direction), for example, so as to intersect with the plurality of gate bus lines GL.

The common signal trunk wiring Wcom has a multilayer structure using two metal layers among the first to third metal layers M1 to M3.

As illustrated in FIG. 8B, since the first wiring unit ws of the common signal trunk wiring Wcom extends so as to intersect with the source bus line SL, the first wiring unit ws is formed using two metal layers other than the first metal layer M1 which is the source metal layer (here, the second metal layer M2 and the third metal layer M3). Specifically, the first wiring unit ws has a lower wiring Ls formed in the second metal layer M2 and an upper wiring Us formed in the third metal layer M3. The upper wiring Us is disposed on the lower wiring Ls via an insulating layer (here, interlayer insulating layer 10). When viewed from the normal direction of the substrate 1, the upper wiring Us and the lower wiring Ls extend so as to at least partially overlap each other.

In the first wiring unit ws of the common signal trunk wiring Wcom, one or a plurality of contact units 51 for electrically coupling the upper wiring Us and the lower wiring Ls are formed. The contact unit 51 may have a structure similar to that of the contact unit 40 illustrated in FIG. 3A, for example. That is, in the contact unit 51, the upper wiring Us is in direct contact with the lower wiring Ls in the opening portion 10u formed in the interlayer insulating layer 10.

As illustrated in FIG. 8C, since the second wiring unit wg of the common signal trunk wiring Wcom extends so as to intersect with the gate bus line GL, the second wiring unit wg is formed using two metal layers other than the second metal layer M2 which is the gate metal layer (here, the first metal layer M1 and the third metal layer M3). Specifically, the second wiring unit wg has a lower wiring Lg formed in the first metal layer M1 and an upper wiring Ug formed in the third metal layer M3. The upper wiring Ug is disposed on the lower wiring Lg via the lower insulating layer 5 and the interlayer insulating layer 10. When viewed from the normal direction of the substrate 1, the upper wiring Ug and the lower wiring Lg extend so as to at least partially overlap each other.

In the second wiring unit wg of the common signal trunk wiring Wcom, one or a plurality of contact units 52 for electrically coupling the upper wiring Ug and the lower wiring Lg are formed. The contact unit 52 may have a structure similar to that of the contact unit 42 illustrated in FIG. 6A, for example. That is, in the contact unit 52, the lower insulating layer 5 and the interlayer insulating layer 10 have an opening portion exposing a portion of the lower wiring Lg, and the upper wiring Ug is directly in contact with the lower wiring Lg in the opening portion. The opening portion of the contact unit 52 is configured to include an opening portion 5v formed in the lower insulating layer 5 and an opening portion 10v formed in the interlayer insulating layer 10.

Figure 9:
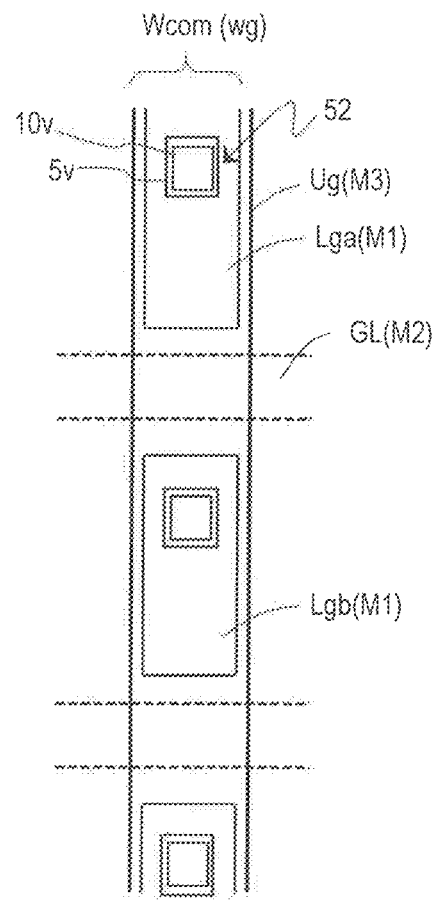
FIG. 9 is a plan view of another second wiring unit wg of the common signal trunk wiring Wcom.

In order to reduce the parasitic capacitance generated at the intersection portion between the second wiring unit wg of the common signal trunk wiring Wcom and the gate bus line GL, as illustrated in FIG. 9, a cutout portion may be provided in the lower wiring Lg or the upper wiring Ug at the intersection portion. In FIG. 9, the cutout portion is provided in the lower wiring Lg. That is, the lower wiring Lg is divided into a plurality of portions Lga and Lgb so as not to overlap the gate bus line GL. Therefore, only the upper wiring Ug of the common signal trunk wiring Wcom overlaps the gate bus line GL at the intersection portion. As described above, the common signal trunk wiring Wcom may partially have a single layer structure. Although not illustrated, the cutout portion may be provided in the upper wiring Ug instead of the lower wiring Lg.

By forming the common signal trunk wiring Wcom in a multilayer structure, the resistance of the common signal trunk wiring Wcom can be reduced. As a result, in the first wiring unit ws of the common signal trunk wiring Wcom, a potential change caused by the influence of the source signal can be suppressed. Similarly, also in the second wiring unit wg, a potential change caused by the influence of the gate signal can be suppressed.

Figure 10:
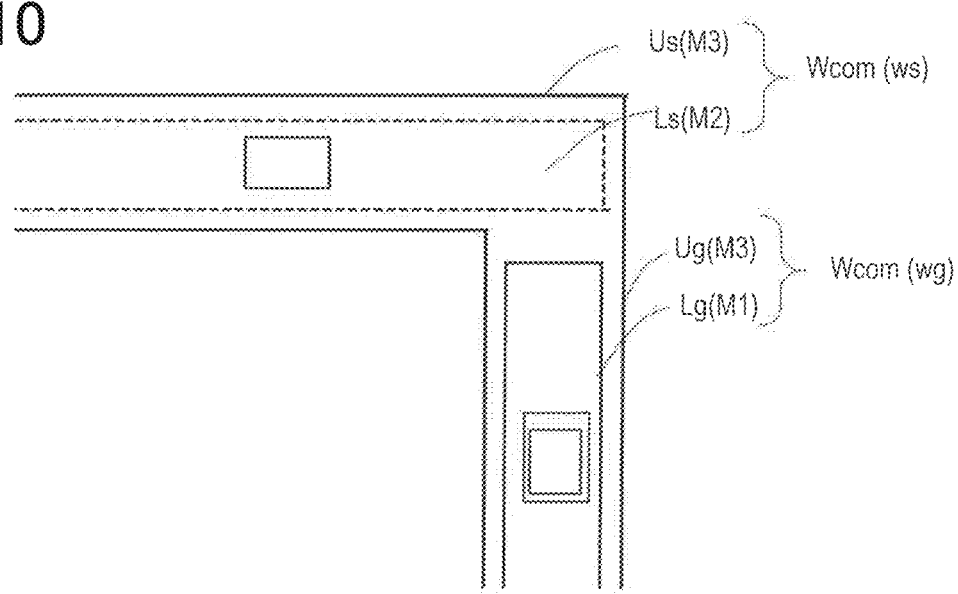
FIG. 10 is a plan view illustrating a coupling portion between the first wiring unit ws and the second wiring unit wg of the common signal trunk wiring Wcom.

In the active matrix substrate in the related art, the first wiring unit of the common signal trunk wiring located in the source-side region of the non-display region is normally formed in the gate metal layer, and the second wiring unit located in the gate-side region is formed in the source metal layer. Therefore, for example, a coupling portion (source-gate coupling portion) electrically coupling these wiring units is provided at a coupling portion between the first wiring unit and the second wiring unit. On the other hand, in the present embodiment, one metal layer of the first metal layer M1 to the third metal layer M3 (another metal layer other than the source metal layer and the gate metal layer) is commonly used by the first wiring unit ws and the second wiring unit wg of the common signal trunk wiring Wcom. Therefore, as illustrated in FIG. 10, at the coupling portion between the first wiring unit ws and the second wiring unit wg, since the wirings in the common metal layer (upper wiring Us and upper wiring Ug in this example) are coupled, it is not required to provide a separate coupling portion.

<Upper Source Structure>

The active matrix substrate of the present embodiment is not limited to a lower source structure substrate, and may have a structure in which the source metal layer is disposed above the gate metal layer (upper source structure).

Figure 11:
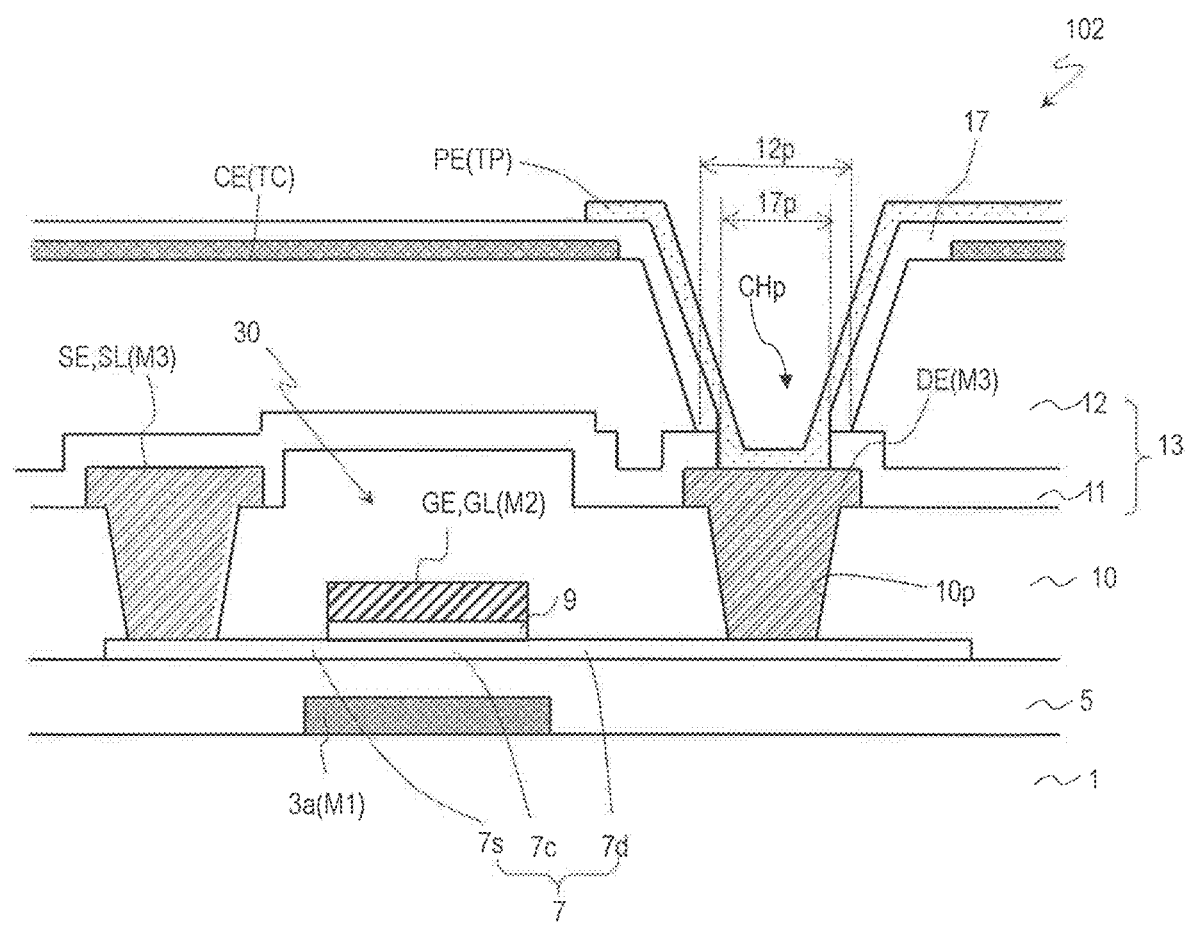
FIG. 11 is a cross-sectional view illustrating a pixel region of an active matrix substrate 102 according to a modification example.

FIG. 11 is a cross-sectional view illustrating a pixel region of an active matrix substrate 102 according to Modification Example 1 having an upper source structure.

The active matrix substrate 102 differs from the active matrix substrate 101 in that the source bus lines SL and the source electrodes SE of the TFTs 30 are formed in the third metal layer M3. In the active matrix substrate 102, the lower metal layer including the light shielding layer 3a is the first metal layer M1, the gate metal layer is the second metal layer M2, and the source metal layer is the third metal layer M3.

The active matrix substrate 102 includes the first metal layer M1 including the light shielding layer 3a of the TFT 30, the lower insulating layer 5 covering the first metal layer M1, the oxide semiconductor layer 7 disposed on the lower insulating layer 5, the gate insulating layer 9, the second metal layer M2 including a gate electrode GE, the interlayer insulating layer 10 covering the second metal layer M2, the third metal layer M3 including the source electrode SE and the drain electrode DE, and the upper insulating layer 13 covering the third metal layer M3 in this order, on the substrate 1. On the upper insulating layer 13, a pixel electrode layer TP and a common electrode layer TC are formed via the dielectric layer 17.

The active matrix substrate 102 has a top gate type TFT 30. The TFT 30 has a structure similar to that of the TFT 20 illustrated in FIGS. 2A and 2B except that the source electrode SE is formed on the interlayer insulating layer 10. In the TFT 30, the source electrode SE and the drain electrode DE are formed on the interlayer insulating layer 10 using the same conductive film. The source electrode SE is coupled to the first region 7s of the oxide semiconductor layer 7 within the source opening portion 10s formed in the interlayer insulating layer 10. The drain electrode DE is coupled to the second region 7d of the oxide semiconductor layer 7 within the drain opening portion 10d formed in the interlayer insulating layer 10.

In the active matrix substrate 102, similarly to the active matrix substrate 101, the resistance of the trunk wiring can be reduced by forming the trunk wiring such as the GDM signal trunk wiring Wgd and the common signal trunk wiring Wcom in a multilayer structure. In the active matrix substrate 101 having the lower source structure, the distance between the source bus line SL and the common electrode CE (distance along the normal direction of the substrate 1) is larger than that in the active matrix substrate 102 having the upper source structure, so that the parasitic capacitance can be reduced. Therefore, the source signal delay can be reduced. In a case where the SSD circuit is provided, the size of the TFT for the SSD circuit can be reduced.

The planar structure and the sectional structure of the GDM signal trunk wiring forming region 202 in the active matrix substrate 102 are the same as the structures described above with reference to FIGS. 3A to 7, and a description thereof will be omitted.

Hereinafter, the common signal trunk wiring Wcom in the active matrix substrate 102 will be described with reference to the drawings.

Figure 12A:
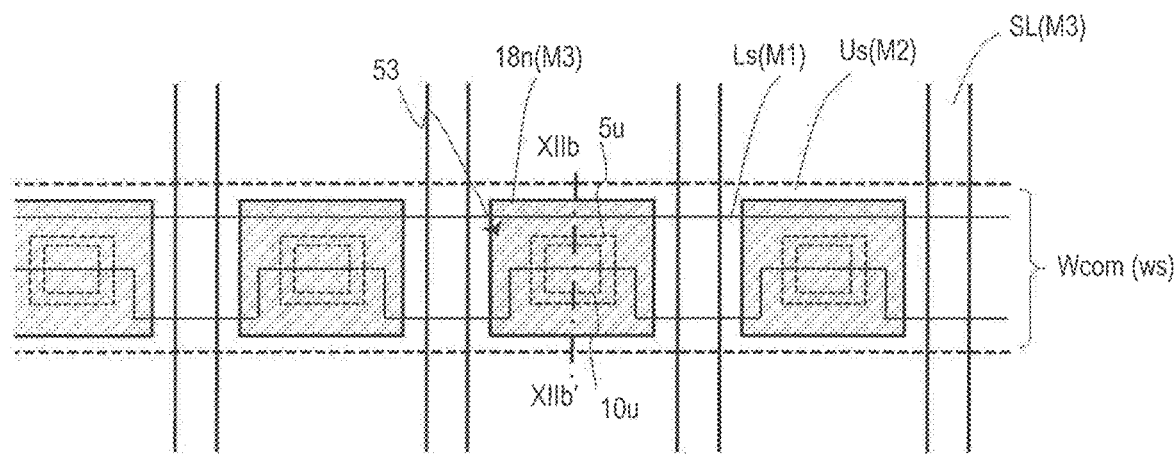
FIG. 12A is a plan view of a first wiring unit ws of a common signal trunk wiring Wcom in the active matrix substrate 102.
Figure 12B:
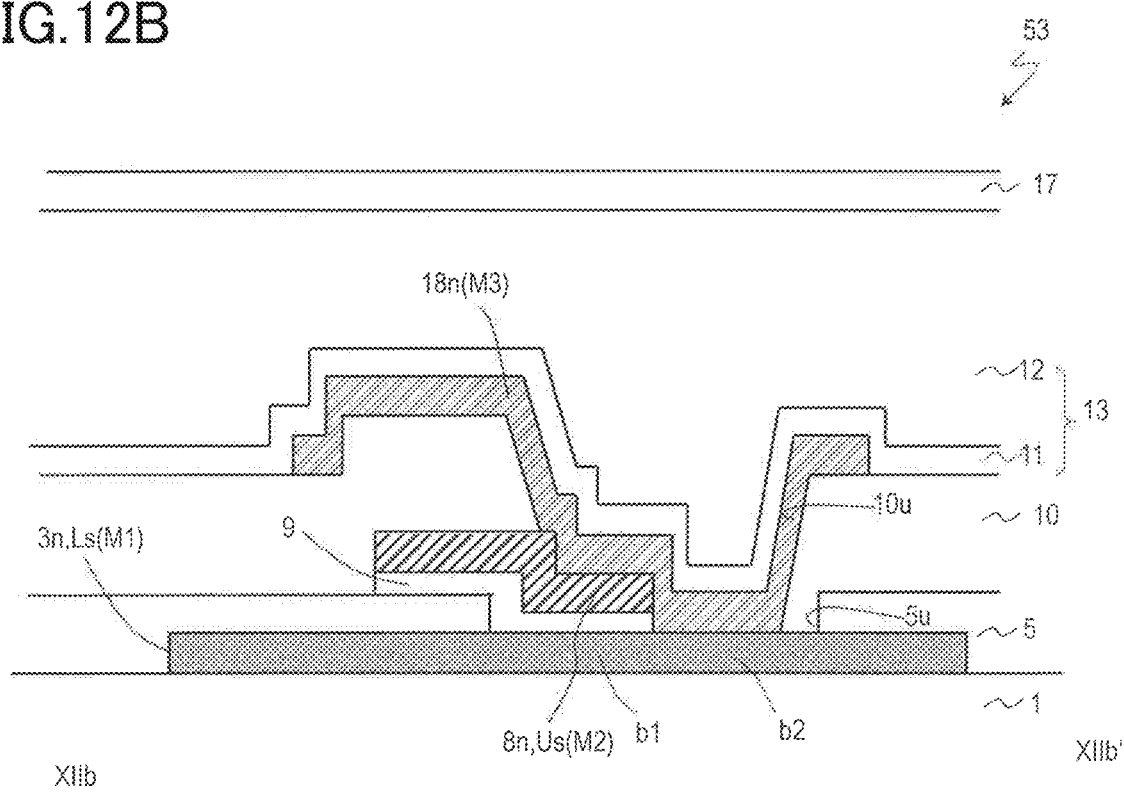
FIG. 12B is a cross-sectional view of the first wiring unit ws of the common signal trunk wiring Wcom in the active matrix substrate 102.

FIGS. 12A and 12B are a plan view and a cross-sectional view, respectively, of the first wiring unit ws located in the source-side region FRs of the non-display region FR in the common signal trunk wiring Wcom. The structure of the second wiring unit wg located in the gate-side region FRg is the same as the structure described above with reference to FIG. 8C, and a description thereof will be omitted.

The first wiring unit ws of the common signal trunk wiring Wcom is formed using two metal layers (here, the first metal layer M1 and the second metal layer M2) other than the third metal layer M3 on which the source bus line SL is formed. Specifically, the first wiring unit ws has a lower wiring Ls formed in the first metal layer M1 and an upper wiring Us formed in the second metal layer M2. The upper wiring Us is disposed on the lower wiring Ls via an insulating layer (here, the lower insulating layer 5 and the gate insulating layer 9). When viewed from the normal direction of the substrate 1, the upper wiring Us and the lower wiring Ls extend so as to at least partially overlap each other.

One or a plurality of contact units 53 for electrically coupling the upper wiring Us and the lower wiring Ls are formed in the first wiring unit ws of the common signal trunk wiring Wcom. In the contact unit 53, the upper wiring Us and the lower wiring Ls are electrically coupled via a third coupling layer 18n provided in the third metal layer M3. The third coupling layer 18n may be an island-shaped portion formed separately from the source bus line SL in the third metal layer M3.

When the coupling portion 3n of the lower wiring Ls in the contact unit 53 is a "first coupling layer" and the coupling portion 8n of the upper wiring Us is a "second coupling layer", the contact unit 53 has a sectional structure similar to that of the trunk wiring coupling portion Cwb described above with reference to FIG. 3B. In the contact unit 53, an opening portion 5u exposing a portion of the lower wiring Ls is formed in the lower insulating layer 5 extending on the lower wiring Ls. The upper wiring Us is disposed only on a portion (first portion) b1 of the exposed portion of the lower wiring Ls via the gate insulating layer 9. The interlayer insulating layer 10 extends on the upper wiring Us, and an opening portion 10u exposing a portion of the upper wiring Us and another portion (second portion) b2 of the exposed portion of the lower wiring Ls is formed in the interlayer insulating layer 10. The opening portion 10u and the opening portion 5u at least partially overlap each other to form a contact hole. The third coupling layer 18n is disposed on the interlayer insulating layer 10 and in the contact hole, and is coupled to the second portion b2 of the upper wiring Us and the lower wiring Ls in the contact hole. The insulating layers (here, the upper insulating layer 13 and the dielectric layer 17) extend on the third coupling layer 18n.

<Other TFT>

Although not illustrated, the active matrix substrates 101 and 102 include another oxide semiconductor TFT formed in the non-display region FR. Another oxide semiconductor TFT is, for example, a circuit TFT. For example, the gate driver GD includes a plurality of TFTs (GD circuit TFTs). In a case where an SSD circuit is formed in the non-display region, the SSD circuit also includes the plurality of TFTs (SSD circuit TFTs). The structures of the GD circuit TFT and the SSD circuit TFT are not particularly limited. For example, in the active matrix substrate 101, a portion or all of the GD circuit TFT and the SSD circuit TFT (collectively referred to as "circuit TFTs") may be a top gate type oxide semiconductor TFT having a structure similar to that of the TFT 20 as the pixel TFT (that is, the source electrode is formed in the first metal layer M1, and the drain electrode is formed in the third metal layer M3). Such a TFT structure is called a "bottom source structure". Alternatively, a portion or all of the circuit TFT may be a top gate type oxide semiconductor TFT in which the source electrode and the drain electrode are formed in the third metal layer M3. Such a TFT structure is called a "top source structure". Similarly, in the active matrix substrate 102, a portion or all of the circuit TFTs may have a structure (top source structure) similar to that of the TFT 30 as the pixel TFT. Alternatively, the source electrode may have a bottom source structure formed in the first metal layer M1.

From the viewpoint of reducing the source signal delay in the display region DR, it is preferable that the pixel TFT has a bottom source structure. From the viewpoint of suitably laying out the TFT in a relatively small region, it is preferable that the circuit TFT has a top source structure. In the bottom source structure, since the light shielding layer and the source electrode disposed below the channel region are the same layer as each other, it is required for the light shielding layer and the source bus line to be separated from each other by a predetermined distance so as not to be coupled. On the other hand, since the light shielding layer and the source electrode may overlap each other when viewed from the normal direction of the substrate, the top source structure is advantageous in a region where the layout space of the TFT is small, such as a peripheral circuit portion.

<Method for Manufacturing Active Matrix Substrate 101>

Next, an example of a method for manufacturing the active matrix substrate of the present embodiment will be described with reference to the drawings, taking the active matrix substrate 101 having the lower source structure as an example.

FIGS. 13A to 13J are schematic step sectional views for describing a method for manufacturing the active matrix substrate 101, and illustrate a method for manufacturing the pixel region PIX, a coupling portion C1, and a coupling portion C2. The coupling portion C1 is a coupling portion that couples the electrode and wiring in the first metal layer M1 and the electrode and wiring in the third metal layer M3, and includes, for example, a terminal unit. The coupling portion C2 is a coupling portion that couples the electrode and wiring in the first metal layer M1 and the electrode and wiring in the second metal layer M2, and includes, for example, a source-gate coupling portion and a trunk wiring coupling portion Cwb. Each of the trunk wiring coupling portion Cwb, the contact unit coupling the upper wiring and the lower wiring of the trunk wiring, and the like may have a structure of either the coupling portion C1 or C2 depending on the metal layer on which the wiring to be coupled is formed.

Figure 13A:
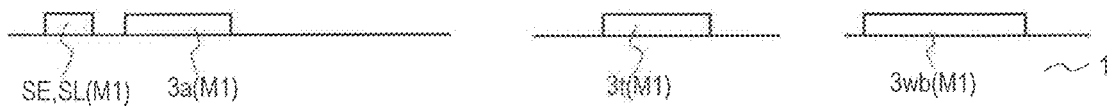
FIG. 13A, FIG. 13B, FIG. 13C, FIG. 13D, FIG. 13E, FIG. 13F, FIG. 13G, FIG. 13H, FIG. 13I, and FIG. 13J are step sectional views illustrating a method for manufacturing the active matrix substrate 101.

Step 1: Formation of First Metal Layer M1 (FIG. 13A)

A first conductive film (thickness: for example, 50 nm or more and 500 nm or less) is formed on the substrate 1 by, for example, a sputtering method. Next, patterning (for example, wet etching) of the first conductive film is performed by a known photolithography step. As described above, as illustrated in FIG. 13A, the first metal layer M1 including the source bus line SL, the source electrode SE, the light shielding layer 3a, the lower conductive layer 3t of the coupling portion C1, and the first coupling layer 3wb of the coupling portion C2 is formed. For example, in a case of forming the GDM signal trunk wiring Wgd illustrated in FIGS. 3A and 3B, the branch wiring B is also formed in the first metal layer M1.

As the substrate 1, a transparent and insulating substrate, for example, a glass substrate, a silicon substrate, a plastic substrate (resin substrate) having heat resistance, or the like can be used.

The material of the source conductive film is not particularly limited, and a film containing a metal such as aluminum (Al), tungsten (W), molybdenum (Mo), tantalum (Ta), chromium (Cr), titanium (Ti), or and copper (Cu), an alloy thereof, or a metal nitride thereof can be appropriately used. Alternatively, a laminated film in which a plurality of these films are laminated may be used. Here, a laminated film (Cu/Ti film) including a Ti film (thickness: 30 nm) and a Cu film (thickness: 200 nm) in this order from the substrate 1 side is used as the source conductive film.

Step 2: Formation of Lower Insulating Layer 5 (FIG. 13B)

Figure 13B:
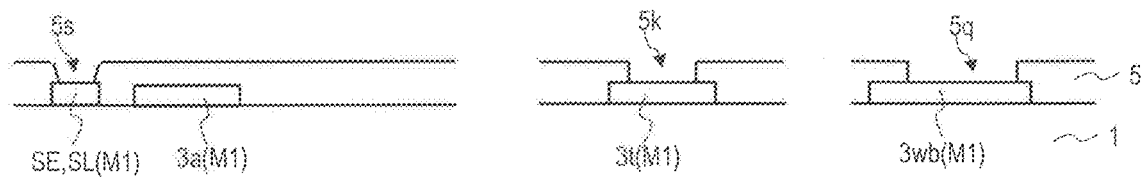

Next, as illustrated in FIG. 13B, a lower insulating layer 5 (thickness: for example, 200 nm or more and 600 nm or less) is formed so as to cover the first metal layer M1.

The lower insulating layer 5 is formed by, for example, a CVD method. As the lower insulating layer 5, a silicon oxide ($SiO_x$) layer, a silicon nitride ($SiN_x$) layer, a silicon oxynitride ($SiO_xN_y$; x>y) layer, a silicon nitride oxide ($SiN_xO_y$; x>y) layer, or the like can be appropriately used. The lower insulating layer 5 may be a single layer or may have a laminated structure. For example, a silicon nitride ($SiN_x$) layer, a silicon nitride oxide layer, or the like may be formed on the substrate side (lower layer) to prevent diffusion of impurities and the like from the substrate 1, and a silicon oxide ($SiO_2$) layer, a silicon oxynitride layer, or the like may be formed on a layer thereover (upper layer) to secure insulation. Here, as the lower insulating layer 5, a laminated film having a silicon nitride ($SiN_x$) layer (thickness: 50 to 600 nm) as a lower layer and a silicon oxide ($SiO_2$) layer (thickness: 50 to 600 nm) as an upper layer may be formed. When an oxide film such as a silicon oxide film is used as the lower insulating layer 5 (in a case where the lower insulating layer 5 has a laminated structure, as an uppermost layer), since oxidation deficiency generated in a channel region of an oxide semiconductor layer formed later can be reduced by the oxide film, reduction in resistance of the channel region can be suppressed.

Thereafter, the lower insulating layer 5 is patterned (for example, dry-etched) by a known photolithography step. As a result, a source opening portion 5s exposing a portion of source electrode SE (or source bus line SL), an opening portion 5k exposing a portion of lower conductive layer 3t, and first opening portion 5q exposing a portion of first coupling layer 3wb are formed.

Figure 13C:
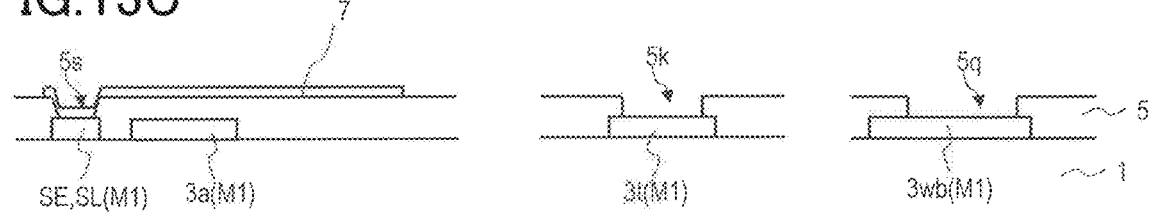

Step 3: Formation of Oxide Semiconductor Layer 7 (FIG. 13C)

Subsequently, an oxide semiconductor film (not illustrated) is formed on the lower insulating layer 5. Thereafter, annealing treatment of the oxide semiconductor film may be performed. The thickness of the oxide semiconductor film may be, for example, 15 nm or more and 200 nm or less.

Subsequently, patterning of the oxide semiconductor film is performed by a known photolithography step. The patterning of the oxide semiconductor film may be performed by, for example, wet etching using an oxalic acid-based etching solution. As a result, as illustrated in FIG. 13C, an oxide semiconductor layer 7 to be an active layer of the TFT 20 is obtained.

The oxide semiconductor film can be formed by, for example, a sputtering method. Here, an In—Ga—Zn—O-based semiconductor film (thickness: 50 nm) containing In, Ga, and Zn is formed as the oxide semiconductor film.

Step 4: Formation of Gate Insulating Layer 9 and Second Metal Layer M2 (FIG. 13D)

Figure 13D:
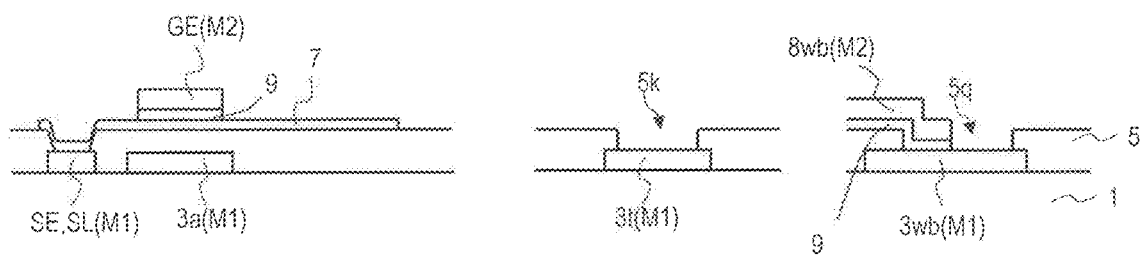

Next, as illustrated in FIG. 13D, a gate insulating film (thickness: for example, 80 nm or more and 250 nm or less) and a second conductive film (thickness: for example, 50 nm or more and 500 nm or less) are formed in this order so as to cover the oxide semiconductor layer 7. Thereafter, by performing patterning of the second conductive film by a known photolithography step, the second metal layer M2 including the gate bus line GL, the gate electrode GE, the second coupling layer 8wb in the coupling portion C2, and the like is formed. For example, in a case of forming the GDM signal trunk wiring Wgd illustrated in FIGS. 3A and 3B, the lower wiring LW of the GDM signal trunk wiring Wgd is also formed in the second metal layer M2. The second coupling layer 8wb is disposed on only a part (first portion) of the exposed surface of the first coupling layer 3wb via the gate insulating layer 9.

Next, the gate insulating film is patterned using the same resist mask as that for patterning the second conductive film (or using the second metal layer M2 as a mask) to form the gate insulating layer 9. According to this method, the side surfaces of the gate electrode GE and the second coupling layer 8wb and the side surfaces of the gate insulating layer 9 substantially match when viewed from the normal direction of the substrate 1.

As the gate insulating film, an insulating film similar to the lower insulating layer 5 (insulating film exemplified as the lower insulating layer 5) can be used. Here, a silicon oxide ($SiO_2$) layer is formed as the gate insulating film. When an oxide film such as a silicon oxide film is used as the insulating film, since oxidation deficiency generated in the channel region of the oxide semiconductor layer 7 can be reduced by the oxide film, reduction in resistance of the channel region can be suppressed.

As the second conductive film, for example, a metal such as molybdenum (Mo), tungsten (W), aluminum (Al), copper (Cu), titanium (Ti), tantalum (Ta), or an alloy thereof can be used. The second conductive film may have a laminated structure including a plurality of layers formed of different conductive materials. Here, as the second conductive film, a Cu and Ti laminated film having a Ti film as a lower layer and a Cu film as an upper layer, or a Cu and Mo laminated film having a Mo film as a lower layer and a Cu film as an upper layer is used.

Step 5: Formation of Interlayer Insulating Layer 10 (FIG. 13E)

Subsequently, resistance lowering treatment of the oxide semiconductor layer 7 may be performed. As the resistance lowering treatment, for example, a plasma treatment may be performed. As a result, when viewed from the normal direction of the main surface of the substrate 1, a region of the oxide semiconductor layer 7 that does not overlap the gate bus line GL and the gate insulating layer 9 is a low-resistance region having a lower specific resistance than that of the region that overlaps these (here, region to be the channel). The low resistance region may be a conductor region (for example, sheet resistance: $200\Omega/\square$ or less). AS described above, the oxide semiconductor layer 7 including the first and second regions 7s and 7d, which are low-resistance regions, and the channel region 7c remaining as a semiconductor region without being reduced in resistance is obtained.

In the resistance lowering treatment (plasma treatment), a portion of the oxide semiconductor layer 7 that is not covered with the gate bus line GL or the gate insulating layer 9 may be exposed to reducing plasma or plasma containing a doping element (for example, argon plasma). As a result, the resistance is reduced near the surface of the exposed portion of the oxide semiconductor layer 7, and the oxide semiconductor layer 7 is a low-resistance region. A portion of the oxide semiconductor layer 7 which is masked by the gate bus line GL or the gate insulating layer 9 remains as a semiconductor region. The method and conditions for the resistance lowering treatment are described in, for example, Japanese Unexamined Patent Application Publication No. 2008-40343. For reference, the entire content of the disclosure of Japanese Unexamined Patent Application Publication No. 2008-40343 is incorporated herein.

Figure 13E:
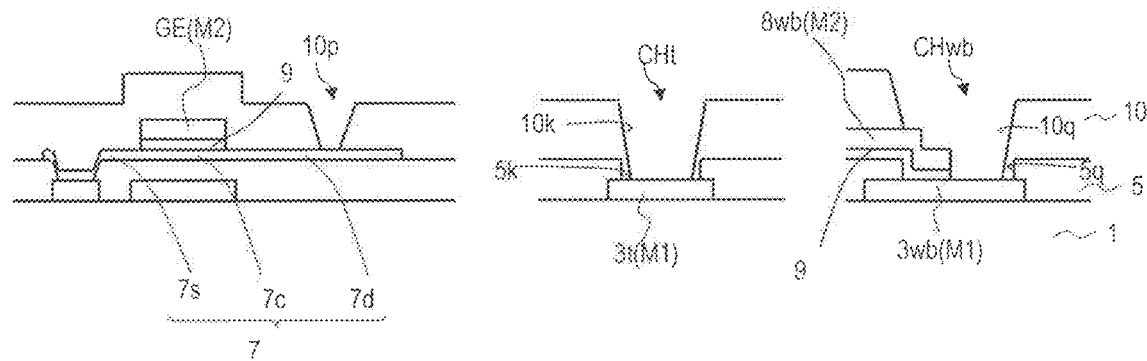

Next, as illustrated in FIG. 13E, an interlayer insulating layer 10 covering the oxide semiconductor layer 7, the gate insulating layer 9, and the gate electrode GE is formed. As the interlayer insulating layer 10, an inorganic insulating layer such as a silicon oxide film, a silicon nitride film, a silicon oxynitride film, a silicon nitride oxide film, or the like can be formed as a single layer or a laminated layer. The thickness of the inorganic insulating layer may be 100 nm or more and 500 nm or less. When the interlayer insulating layer 10 is formed using an insulating film such as a silicon nitride film that reduces an oxide semiconductor, this is preferable because the specific resistance of a region (here, a low-resistance region) in contact with the interlayer insulating layer 10 in the oxide semiconductor layer 7 can be maintained low. Here, as the interlayer insulating layer 10, for example, a laminated film having a $SiO_2$ layer as a lower layer and a $SiN_x$ layer as an upper layer is formed by a CVD method.

In a case where an insulating layer that can reduce an oxide semiconductor (for example, hydrogen-donating layer such as a silicon nitride layer) is used as the interlayer insulating layer 10, even without performing the above-described resistance lowering treatment, a portion of the oxide semiconductor layer 7 that is in contact with the interlayer insulating layer 10 can have a lower resistance than a portion that is not in contact.

Thereafter, a drain opening portion 10p reaching the oxide semiconductor layer 7 is formed in the interlayer insulating layer 10 by, for example, dry etching. In a coupling portion C1 forming region, a contact hole CHt is obtained by forming the opening portion 10k so as to at least partially overlap the opening portion 5k. In a coupling portion C2 forming region, a contact hole CHwb is obtained by forming a second opening portion 10q exposing a portion of the second coupling layer 8wb and a second portion of the exposed surface of the first coupling layer 3wb that is not covered with the gate insulating layer 9.

Figure 13F:
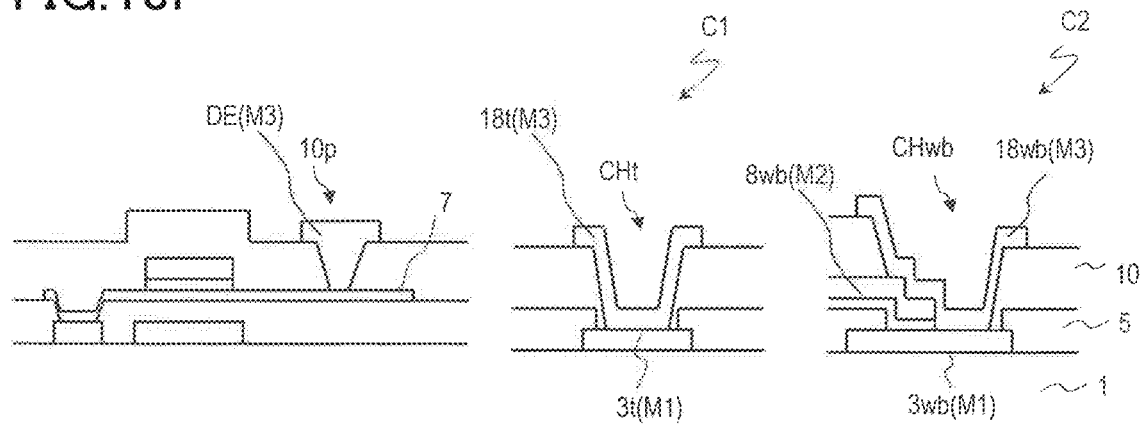

Step 6: Formation of Third Metal Layer M3 (FIG. 13F)

Next, a third conductive film (thickness: for example, 50 nm or more and 500 nm or less) is formed on the interlayer insulating layer 10, and patterning of the third conductive film is performed. As a result, as illustrated in FIG. 13F, a third metal layer M3 including the drain electrode DE, the upper conductive layer 18t of the coupling portion C1, and the third coupling layer 18wb of the coupling portion C2 is formed. The drain electrode DE is disposed on the interlayer insulating layer 10 and in the drain opening portion 10p, and is coupled to the second region 7d of the oxide semiconductor layer 7 in the drain opening portion 10p. The upper conductive layer 18t is disposed on the interlayer insulating layer 10 and in contact hole CHt, and is coupled to the lower conductive layer 3t in the contact hole CHt. The third coupling layer 18wb is disposed on the interlayer insulating layer 10 and in the contact hole CHwb, and is coupled to the second portion of the first coupling layer 3wb and the second coupling layer 8wb in the contact hole CHt.

As the third conductive film, for example, an element selected from aluminum (Al), chromium (Cr), copper (Cu), tantalum (Ta), titanium (Ti), molybdenum (Mo), or tungsten (W), or an alloy containing these elements as components can be used. For example, the third conductive film may have a three-layer structure of a titanium film-aluminum film-titanium film, a three-layer structure of a molybdenum film-aluminum film-molybdenum film, or the like. Here, a laminated film in which a Ti film (thickness: 15 to 70 nm) is a lower layer and a Cu film (thickness: 200 to 400 nm) is an upper layer is used.

Step 7: Formation of Inorganic Insulating Layer 11 and Organic Insulating Layer 12 (FIG. 13G)

Figure 13G:
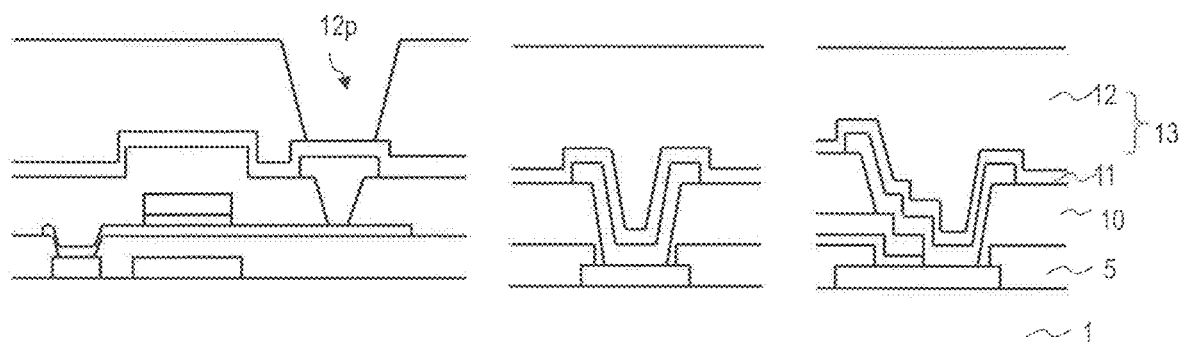

Next, as illustrated in FIG. 13G, an upper insulating layer 13 is formed so as to cover the interlayer insulating layer 10 and the third metal layer M3. Here, as the upper insulating layer 13, an inorganic insulating layer 11 (thickness: for example, 100 nm or more and 500 nm or less) and an organic insulating layer 12 (thickness: for example, 1 to 3 μm, preferably 2 to 3 μm) are formed in this order. The entire portion of the organic insulating layer 12 located in the non-display region may be removed. Alternatively, the organic insulating layer 12 may not be formed.

As the inorganic insulating layer 11, the inorganic insulating film similar to the interlayer insulating layer 10 (insulating film exemplified as the interlayer insulating layer 10) can be used. Here, as the inorganic insulating layer 11, for example, a $SiN_x$ layer (thickness: 300 nm) is formed by a CVD method. The organic insulating layer 12 may be, for example, an organic insulating film (for example, acrylic resin film) containing a photosensitive resin material.

Thereafter, patterning of the organic insulating layer 12 is performed. As a result, in each pixel region PIX, an opening portion 12p exposing a portion of the inorganic insulating layer 11 is formed in the organic insulating layer 12. The opening portion 12p is disposed so as to overlap the drain electrode DE when viewed from the normal direction of the substrate 1.

Step 8: Formation of Common Electrode Layer TC (FIG. 13H)

Figure 13H:
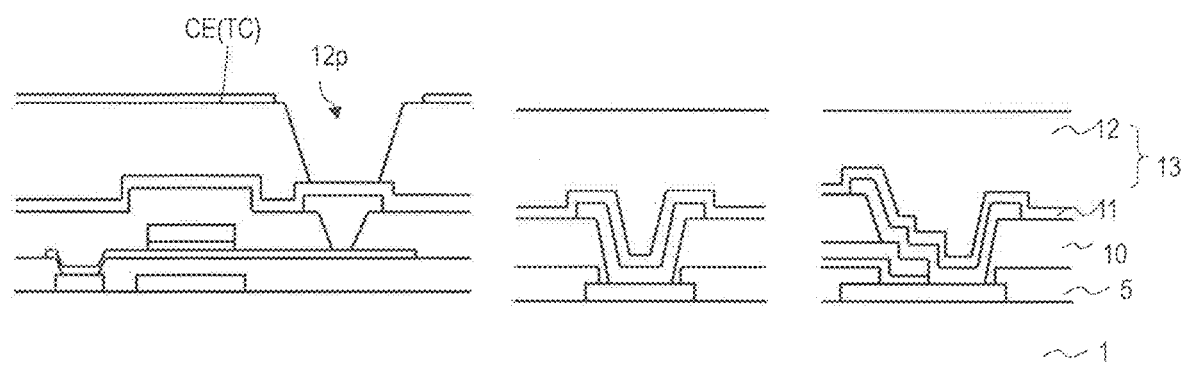

Subsequently, as illustrated in FIG. 13H, a common electrode layer TC including the common electrode CE is formed on the upper insulating layer 13.

First, a second transparent conductive film (not illustrated) (thickness: 20 to 300 nm) is formed on the upper insulating layer 13 and in the opening portion 12p. Here, for example, an indium-zinc oxide film is formed as the second transparent conductive film by a sputtering method. As a material for the second transparent electrode film, a metal oxide such as indium-tin oxide (ITO), indium-zinc oxide, or ZnO can be used. Thereafter, patterning of the second transparent conductive film is performed. In patterning, for example, wet etching may be performed using an oxalic acid-based etching solution. As a result, the common electrode CE is obtained. The common electrode CE may be disposed, for example, over substantially the entire display region except for the pixel contact hole forming region where the pixel contact hole CHp is formed.

Step 9: Formation of Dielectric Layer 17 (FIG. 13I)

Figure 13I:
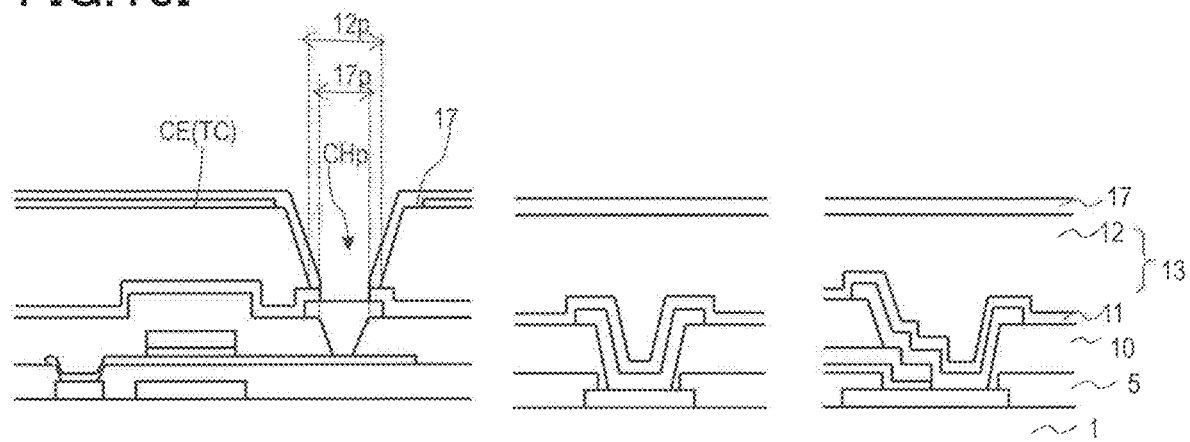

Next, as illustrated in FIG. 13I, a dielectric layer (thickness: 50 to 500 nm) 17 is formed so as to cover the common electrode layer TC, and patterning of the dielectric layer 17 and the inorganic insulating layer 11 are performed.

The dielectric layer 17 is formed on the organic insulating layer 12 and the common electrode CE and in the opening portion 12p in the pixel region PIX. The material of the dielectric layer 17 may be the same as the material exemplified as the material of the inorganic insulating layer 11. Here, a SiN film is formed as the dielectric layer 17 by, for example, a CVD method.

Thereafter, a resist layer (not illustrated) formed on the dielectric layer 17 is formed by a photolithography step. Using the resist layer and the organic insulating layer 12 as a mask, the dielectric layer 17 and the inorganic insulating layer 11 are etched (for example, dry-etched). The etching of the dielectric layer 17 and the inorganic insulating layer 11 may be performed in the same etching step. As a result, a pixel contact hole CHp exposing a portion of the second region 7d of the oxide semiconductor layer 7 is formed in the pixel region PIX. The pixel contact hole CHp is configured to include the opening portion 11p formed in the inorganic insulating layer 11, the opening portion 12p in the organic insulating layer 12, and the opening portion 17p in the dielectric layer 17. The opening portion 17p may be at least partially overlapped the opening portion 12p when viewed from the normal direction of the substrate 1.

Figure 13J:
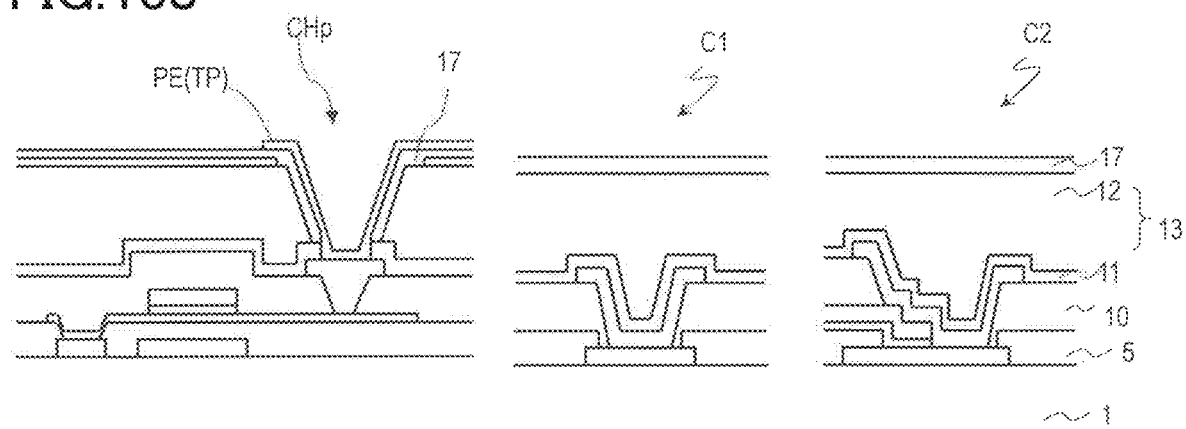

Step 10: Formation of Pixel Electrode Layer TP (FIG. 13J)

Next, a pixel electrode layer TP including the pixel electrode PE is formed.

First, a first transparent conductive film (not illustrated) (thickness: 20 to 300 nm) is formed on the dielectric layer 17 and in the pixel contact hole CHp. The material of the first transparent conductive film may be the same as the material exemplified as the material of the second transparent conductive film (for example, ITO).

Thereafter, patterning of the first transparent conductive film is performed. For example, wet etching of the first transparent conductive film may be performed using an oxalic acid-based etching solution. As a result, as illustrated in FIG. 13J, a pixel electrode PE is obtained. The pixel electrode PE is formed on the dielectric layer 17 and in the pixel contact hole CHp in the pixel region PIX, and is in contact with the second region 7d in the pixel contact hole CHp. As described above, the active matrix substrate 101 is manufactured.

Modification Example 1

Figure 14A:
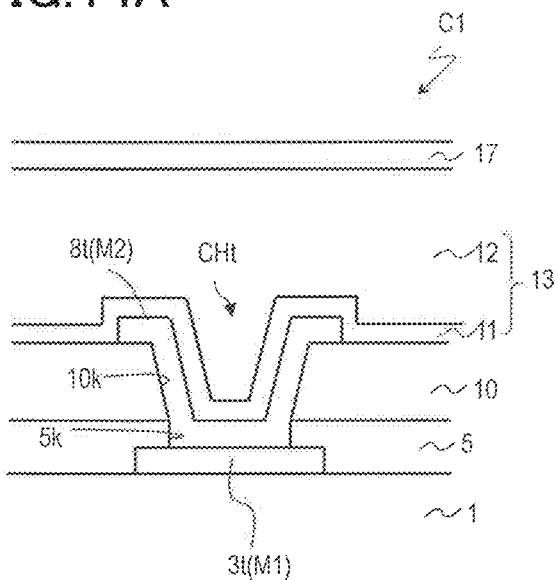
FIG. 14A is a cross-sectional view illustrating a coupling portion C1 of an active matrix substrate according to Modification Example 1.
Figure 14B:
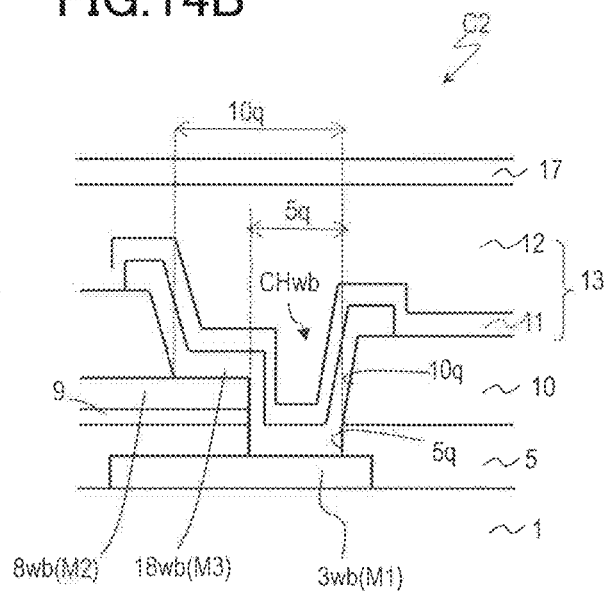
FIG. 14B is a cross-sectional view illustrating a coupling portion C2 of the active matrix substrate according to Modification Example 1.
Figure 14C:
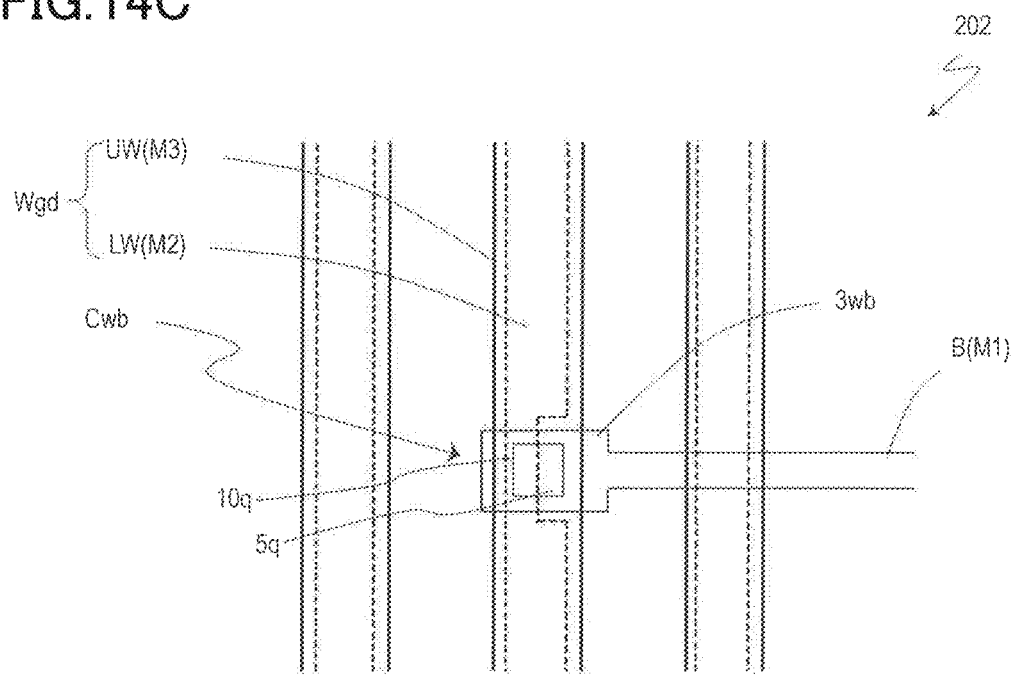
FIG. 14C is a plan view illustrating a GDM signal trunk wiring forming region 202 in the active matrix substrate according to Modification Example 1.

FIGS. 14A and 14B are cross-sectional views illustrating coupling portions C1 and C2 of the active matrix substrate of Modification Example 1, respectively. FIG. 14C is a plan view illustrating a GDM signal trunk wiring forming region 202 in the active matrix substrate of Modification Example 1.

As illustrated in FIG. 14A, the coupling portion C1 in Modification Example 1 differs from the coupling portion C1 illustrated in FIG. 13J in that the side surface of the opening portion 5k of the lower insulating layer 5 and the side surface of the opening portion 10k of the interlayer insulating layer 10 are aligned with each other in the contact hole CHt.

As illustrated in FIG. 14B, in the coupling portion C2 in Modification Example 1, the gate insulating layer 9 and the second coupling layer 8wb are disposed on the lower insulating layer 5. In the contact hole CHwb, a portion of the side surface of the first opening portion 5q of the lower insulating layer 5 is aligned with the side surfaces of the gate insulating layer 9 and the second coupling layer 8wb, and the other portion of the side surface of the first opening portion 5q is aligned with the side surface of the second opening portion 10q of the interlayer insulating layer 10. Other structure is the same as that of the coupling portion C2 illustrated in FIG. 13J.

The trunk wiring coupling portion Cwb has a structure similar to that of the coupling portion C2. Therefore, as illustrated in FIG. 14C, in the trunk wiring coupling portion Cwb, when viewed from the normal direction of the substrate 1, a portion of the side surface of the first opening portion 5q is aligned with the second coupling layer 8wb (lower wiring LW in this example), and the other portion is aligned with the side surface of the second opening portion 10q.

A method for manufacturing the active matrix substrate of Modification Example 1 is the same as the method for manufacturing the active matrix substrate 101 described above. However, when forming the source opening portion 5s in the lower insulating layer 5 in the pixel region in STEP 2, the opening portions 5k and 5q are not formed in the coupling portion C1 forming region and the coupling portion C2 forming region. These opening portions 5k and 5q can be formed simultaneously when forming the second opening portion 10q in the interlayer insulating layer 10 in STEP 5. That is, in STEP 5, the contact holes CHt and CHwb are formed by etching the interlayer insulating layer 10 and the lower insulating layer 5 in the coupling portions C1 and C2 forming region.

FIGS. 15A to 15F are step sectional views illustrating the method for manufacturing the active matrix substrate of Modification Example 1. Hereinafter, differences from the above method will be mainly described.

Figure 15A:
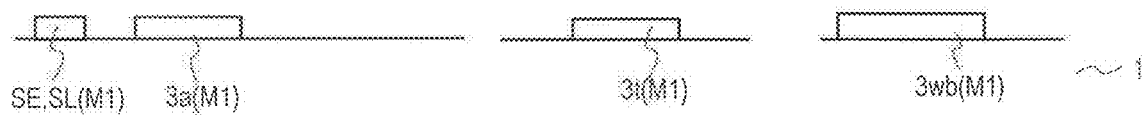
FIG. 15A, FIG. 15B, FIG. 15C, FIG. 15D, FIG. 15E, and FIG. 15F, are step sectional views illustrating a method for manufacturing the active matrix substrate according to Modification Example 1.
Figure 15B:
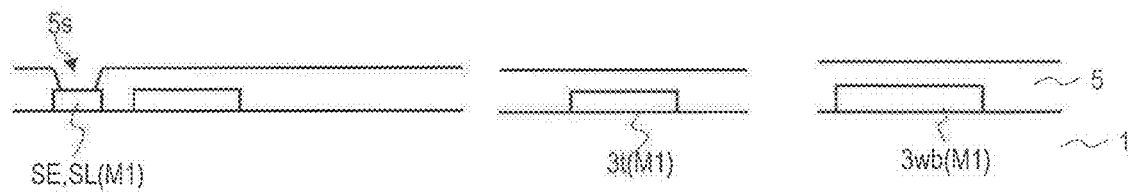

As illustrated in FIG. 15A, a first metal layer M1 is formed by the same method as described above (STEP 1). Thereafter, as illustrated in FIG. 15B, a lower insulating layer 5 covering the first metal layer M1 is formed, and a source opening portion 5s is formed in the lower insulating layer 5 in the pixel region PIX (STEP 2). In the coupling portion C1 forming region and the coupling portion C2 forming region, the lower insulating layer 5 is in a state of covering the lower conductive layer 3t and the entire first coupling layer 3wb.

Figure 15C:
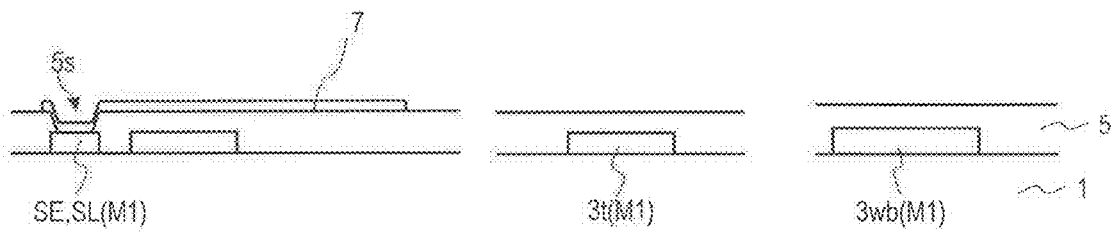

Subsequently, as illustrated in FIG. 15C, an oxide semiconductor layer 7 is formed (STEP 3). In the above method, an oxalic acid-based etching solution is used for patterning the oxide semiconductor film, and here, a PAN-based etching solution containing phosphoric acid, nitric acid, and acetic acid may be used.

In the method described above with reference to FIG. 13C, the oxide semiconductor film is etched in a state where the surfaces (the lower conductive layer 3t and the first coupling layer 3wb) of the first metal layer M1 are exposed by the opening portions 5k and 5q. Therefore, when a PAN-based etching solution is used, there is a possibility that the exposed portion of the first metal layer M1 may also be etched. For example, in a case where the upper layer of the first metal layer M1 is a Cu layer, the Cu layer may be etched and disappear. On the other hand, in Modification Example 1, as illustrated in FIG. 15C, the surface of the first metal layer M1 exposed by the source opening portion 5s is protected by the oxide semiconductor film in the pixel region PIX, and the exposed surface of the first metal layer M1 is protected by the lower insulating layer 5 in the coupling portion C1 and coupling portion C2 forming region. Therefore, even when the oxide semiconductor film is patterned using a PAN-based etching solution, the first metal layer M1 is not etched.

Figure 15D:
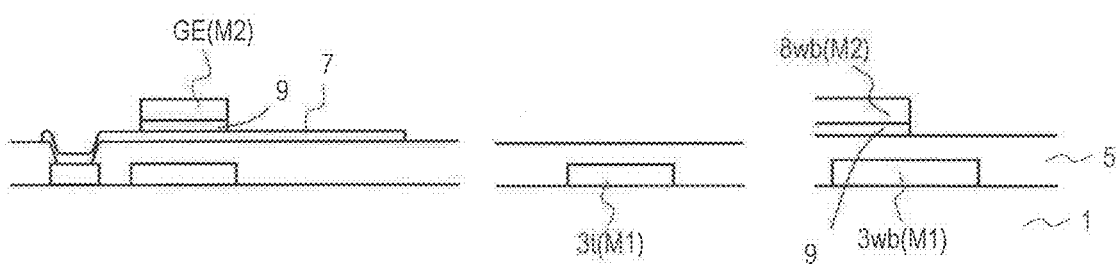

Thereafter, as illustrated in FIG. 15D, a gate insulating layer 9 and a second metal layer M2 are formed (STEP 4). In the forming region of the coupling portion C2, the gate insulating layer 9 and the second coupling layer 8wb are disposed on a portion of the first coupling layer 3wb via the lower insulating layer 5.

Figure 15E:
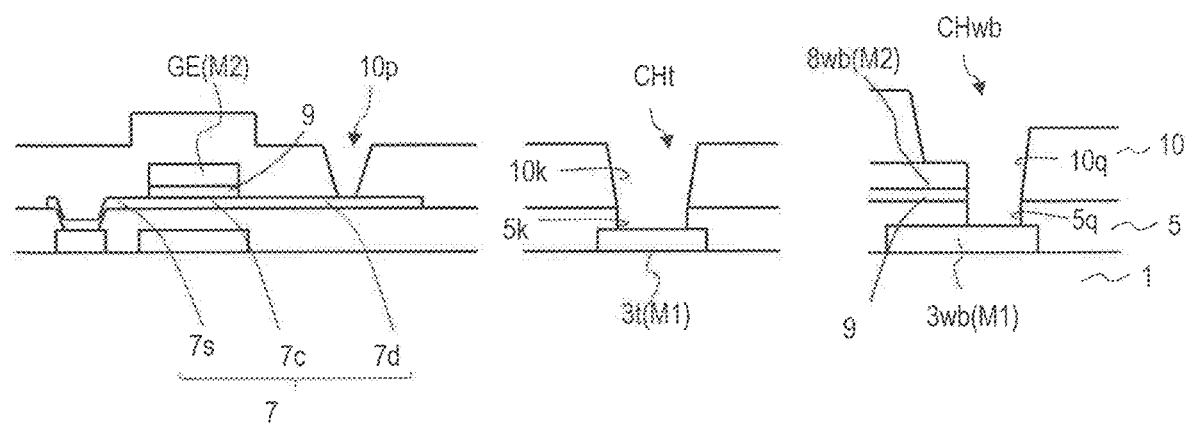

Next, as illustrated in FIG. 15E, after forming the interlayer insulating layer 10 covering the gate electrode GE, patterning of the interlayer insulating layer 10 and the lower insulating layer 5 are performed (STEP 5). As a result, a drain opening portion 10p is formed in the pixel region PIX.

In the coupling portion C1 forming region, a contact hole CHt exposing a portion of the lower conductive layer 3t is formed in the interlayer insulating layer 10 and the lower insulating layer 5. The contact hole CHt is configured to include an opening portion 5k of the lower insulating layer 5 and an opening portion 10k of the interlayer insulating layer 10. Since the lower insulating layer 5 and the interlayer insulating layer 10 are etched using the same resist mask (not illustrated), the side surface of opening portion 5k and the side surface of opening portion 10k are aligned with each other in the contact hole CHt.

In the coupling portion C2 forming region, a contact hole CHwb exposing a portion of the first coupling layer 3wb (a portion that does not overlap the second coupling layer 8wb when viewed in the normal direction of the substrate 1) and a portion of the second coupling layer 8wb is formed in the interlayer insulating layer 10 and the lower insulating layer 5. The contact hole CHwb is configured to include a first opening portion 5q of the lower insulating layer 5 and a second opening portion 10q of the interlayer insulating layer 10. The lower insulating layer 5 is etched using a resist mask (not illustrated) on the interlayer insulating layer 10 and the second coupling layer 8wb in the second metal layer M2 as a mask. Therefore, in contact hole CHwb, a portion of the side surface of first opening portion 5q is aligned with the side surface of second coupling layer 8wb and the gate insulating layer 9, and the other portion is aligned with the side surface of the second opening portion 10q.

Figure 15F:
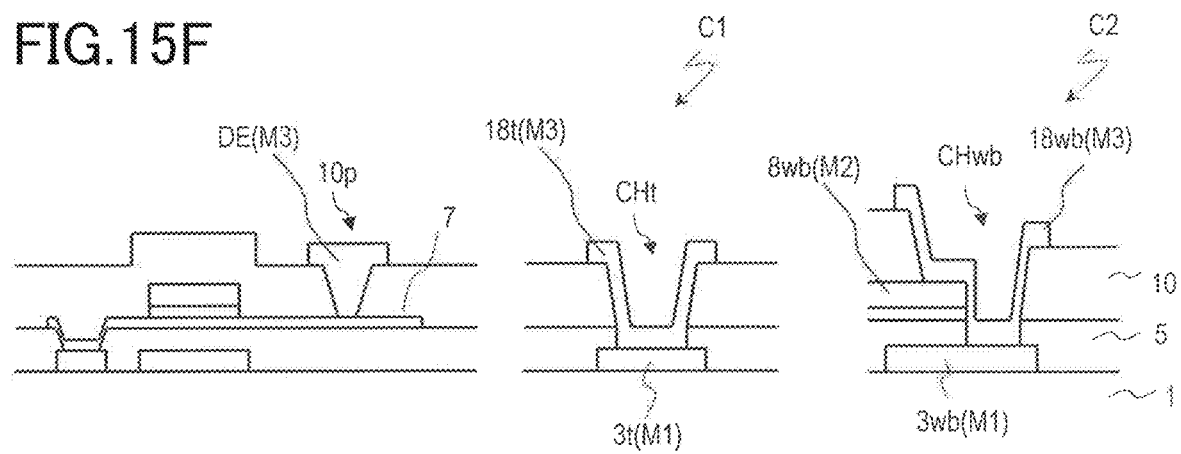

Subsequently, as illustrated in FIG. 15F, by the same method as described above, the drain electrode DE in contact with the oxide semiconductor layer 7 in the opening portion 10p, the upper conductive layer 18t in contact with the lower conductive layer 3t in the contact hole CHt, and a third coupling layer 18wb in contact with the second coupling layer 8wb and the first coupling layer 3wb in the contact hole CHwb are formed.

Thereafter, although not illustrated, by the same method as described above, the upper insulating layer 13, the common electrode CE, the dielectric layer 17, and the pixel electrode PE are formed in this order (STEP 7 to STEP 10) to obtain the active matrix substrate of Modification Example 1.

Modification Example 2

Figure 16A:
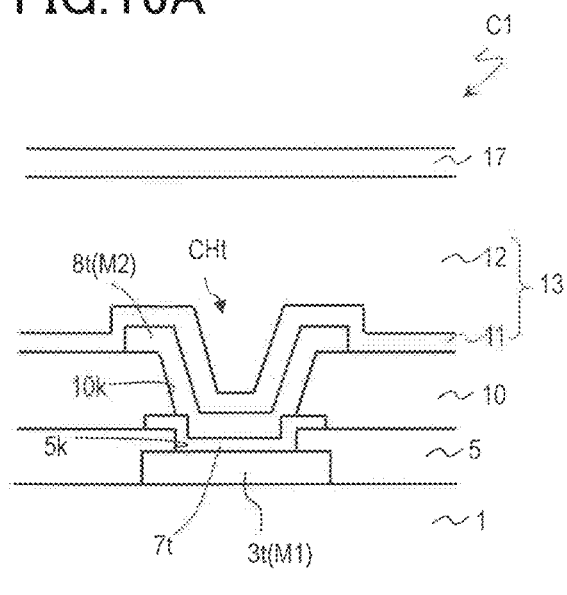
FIG. 16A is a cross-sectional view illustrating a coupling portion C1 of an active matrix substrate according to Modification Example 2.
Figure 16B:
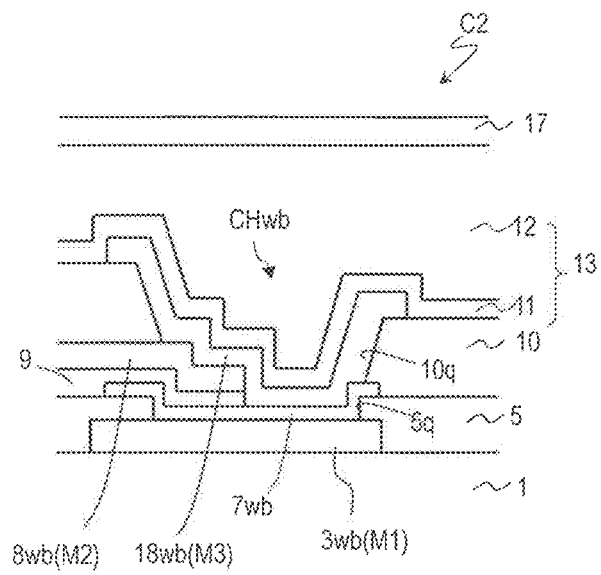
FIG. 16B is a cross-sectional view illustrating a coupling portion C2 of the active matrix substrate according to Modification Example 2.
Figure 16C:
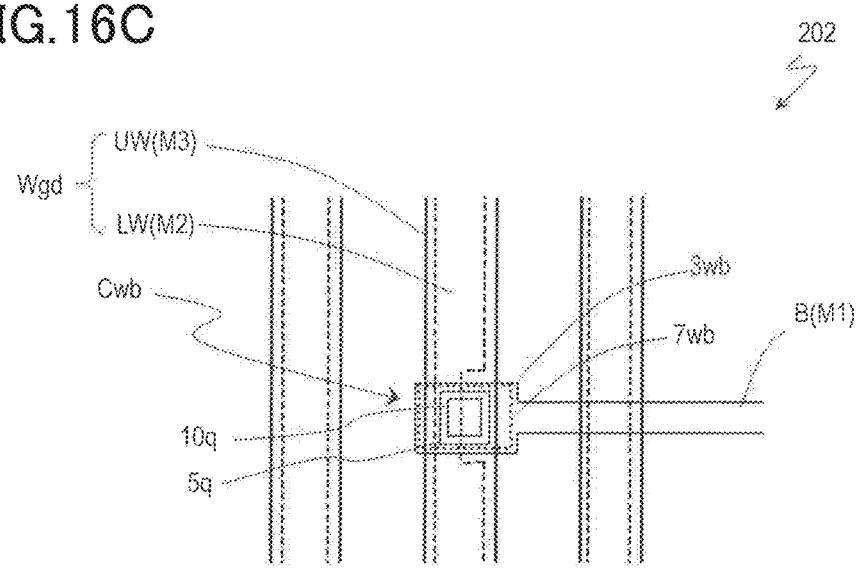
FIG. 16C is a plan view illustrating a GDM signal trunk wiring forming region 202 in the active matrix substrate according to Modification Example 2.

FIGS. 16A and 16B are cross-sectional views illustrating coupling portions C1 and C2 of an active matrix substrate of Modification Example 2, respectively. FIG. 16C is a plan view illustrating a GDM signal trunk wiring forming region 202 in the active matrix substrate of Modification Example 2.

As illustrated in FIG. 16A, the coupling portion C1 in Modification Example 2 differs from the coupling portion C1 illustrated in FIG. 13J in that the coupling portion C1 is formed of the same oxide film as the oxide semiconductor layer 7, and further includes an oxide layer 7t disposed on the lower insulating layer 5 and in the opening portion 5k.

The oxide layer 7t is a low-resistance region having a lower resistance than that of the channel region 7c. The oxide layer 7t is in contact with the lower conductive layer 3t in the opening portion 5k of the lower insulating layer 5. The upper conductive layer 8t is in contact with the oxide layer 7t in the opening portion 10k (contact hole CHt) of the interlayer insulating layer 10. That is, the upper conductive layer 8t is electrically coupled to the lower conductive layer 3t via the oxide layer 7t.

As illustrated in FIG. 16B, similarly, the coupling portion C2 in Modification Example 2 is also formed of the same oxide film as the oxide semiconductor layer 7, and further includes an oxide layer 7wb disposed on the lower insulating layer 5 and in the first opening portion Sq. The gate insulating layer 9 and the second coupling layer 8wb are disposed only on a portion of the oxide layer 7wb. The second opening portion 10q (contact hole CHwb) formed in the interlayer insulating layer 10 is disposed to expose a portion of the second coupling layer 8wb and another portion of the oxide layer 7wb (a portion of the region not covered with the gate insulating layer 9). The third coupling layer 18wb is in contact with the second coupling layer 8wb and the oxide layer 7wb in the second opening portion 10q. A portion of the oxide layer 7wb not covered with the gate insulating layer 9 is a low-resistance region having a lower specific resistance than that of a portion covered with the gate insulating layer 9.

The trunk wiring coupling portion Cwb has a structure similar to that of the coupling portion C2. As illustrated in FIG. 16C, an island-shaped oxide layer 7wb is disposed in the trunk wiring coupling portion Cwb so as to at least partially overlap the branch wiring B as the first coupling layer when viewed from the normal direction of the substrate 1. The oxide layer 7wb only partially overlaps the lower wiring LW as the second coupling layer.

The method for manufacturing the active matrix substrate according to Modification Example 2 is different the method for manufacturing the active matrix substrate 101 described above in that the oxide semiconductor layer 7, the oxide layer 7t, and the oxide layer 7wb are formed by patterning the oxide semiconductor film in STEP 3.

FIGS. 17A to 17F are step sectional views for describing another method for manufacturing the active matrix substrate of Modification Example 2. Hereinafter, differences from the above method will be mainly described.

Figure 17A:
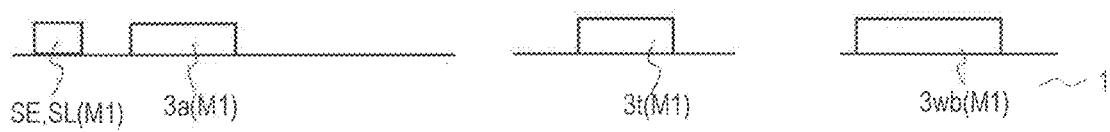
FIG. 17A, FIG. 17B, FIG. 17C, FIG. 17D, FIG. 17E, and FIG. 17F, are step sectional views illustrating a method for manufacturing the active matrix substrate according to Modification Example 2.
Figure 17B:
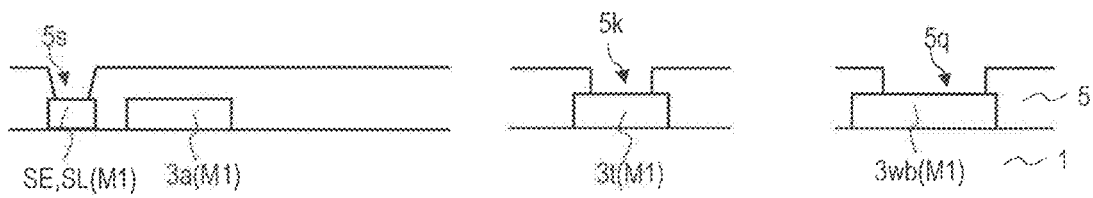

As illustrated in FIG. 17A, a first metal layer M1 is formed by the same method as described above (STEP 1). Thereafter, as illustrated in FIG. 17B, a lower insulating layer 5 covering the first metal layer M1 is formed, a source opening portion 5s, an opening portion 5k exposing a portion of the lower conductive layer 3t, a first opening portion 5q exposing a portion of the first coupling layer 3wb are formed in the lower insulating layer 5 (STEP 2).

Figure 17C:
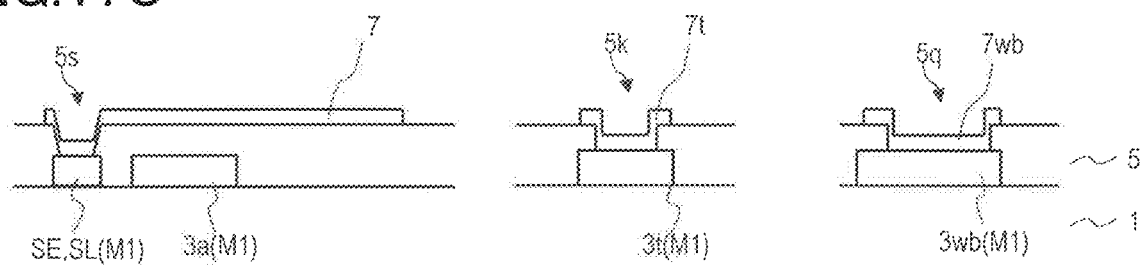

Subsequently, an oxide semiconductor film is formed in the lower insulating layer 5 and in the opening portions 5s, 5k, and 5q, and patterning is performed (STEP 3). As a result, as illustrated in FIG. 17C, an oxide semiconductor layer 7 in contact with the oxide semiconductor layer 7 in the source opening portion 5s, an oxide layer 7t in contact with the lower conductive layer 3t in the opening portion 5k, and an oxide layer 7wb in contact with the first coupling layer 3wb in the first opening portion 5q are obtained. The oxide layer 7t preferably covers the entire exposed surface of the lower conductive layer 3t. Similarly, the oxide layer 7wb preferably covers the entire exposed surface of the first coupling layer 3wb.

In the method for manufacturing the active matrix substrate 101 described above with reference to FIG. 13C, an oxalic acid-based etching solution is used for patterning the oxide semiconductor film. Here, a PAN-based etching solution containing phosphoric acid, nitric acid, and acetic acid may be used. In Modification Example 2, the surface of the first metal layer M1 exposed by the source opening portion 5s and the opening portions 5k and 5q is protected by the oxide semiconductor film (the oxide semiconductor layer 7, the oxide layers 7t and 7wb). Therefore, etching is not performed even when a PAN-based etching solution is used.

Figure 17D:
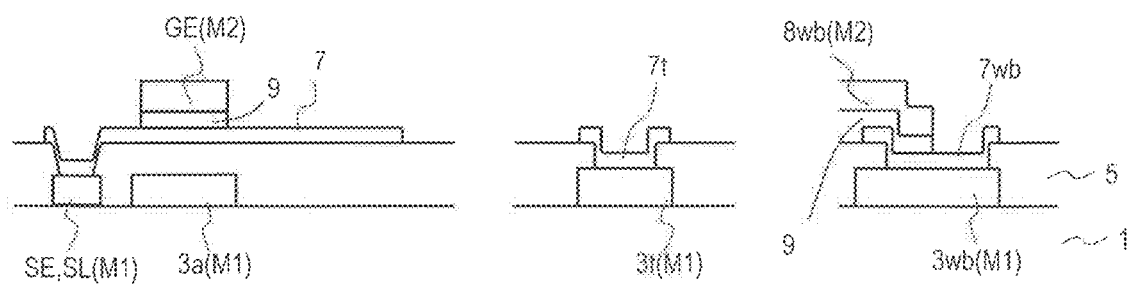

Thereafter, as illustrated in FIG. 17D, a gate insulating layer 9 and a second metal layer M2 are formed (STEP 4). The second coupling layer 8wb is disposed only on a portion (first portion) of the oxide layer 7wb via the gate insulating layer 9.

Next, by performing a resistance lowering treatment, the first region 7s and the second region 7d of the oxide semiconductor layer 7, the oxide layer 7t, and the second portion of the oxide layer 7wb not covered with the gate insulating layer 9 are a low-resistance region having a lower specific resistance than that of the first portion of the oxide layer 7wb and the channel region 7c.

Figure 17E:
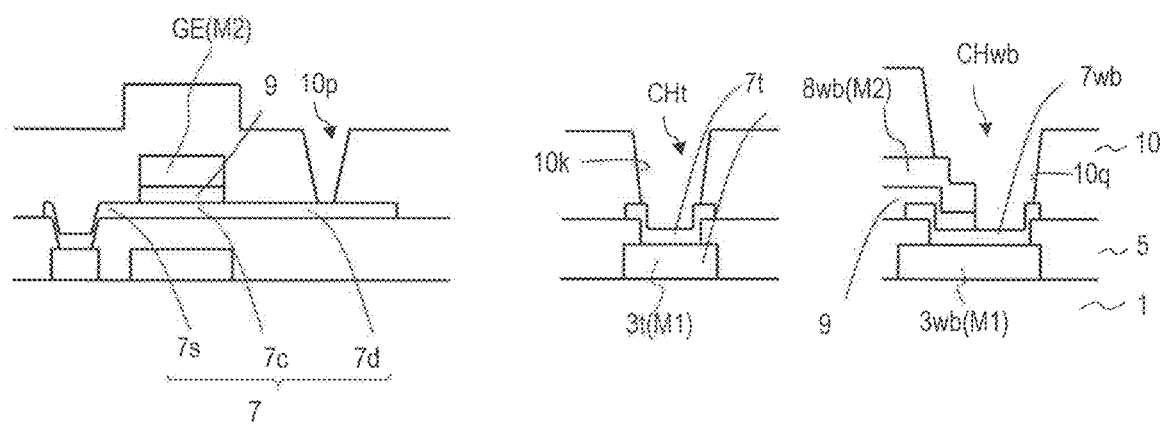

Next, as illustrated in FIG. 17E, after forming the interlayer insulating layer 10 covering the second metal layer M2, patterning of the interlayer insulating layer 10 and the lower insulating layer 5 are performed (STEP 5). As a result, a drain opening portion 10p is formed in the pixel region PIX. In the coupling portion C1 forming region, an opening portion 10k (contact hole CHt) exposing a portion of the oxide layer 7t is formed in the interlayer insulating layer 10. In the coupling portion C2 forming region, a second opening portion 10q (contact hole CHwb) exposing a portion of the second portion (low resistance region) of the oxide layer 7wb and a portion of the second coupling layer 8wb is formed in the interlayer insulating layer 10.

Figure 17F:
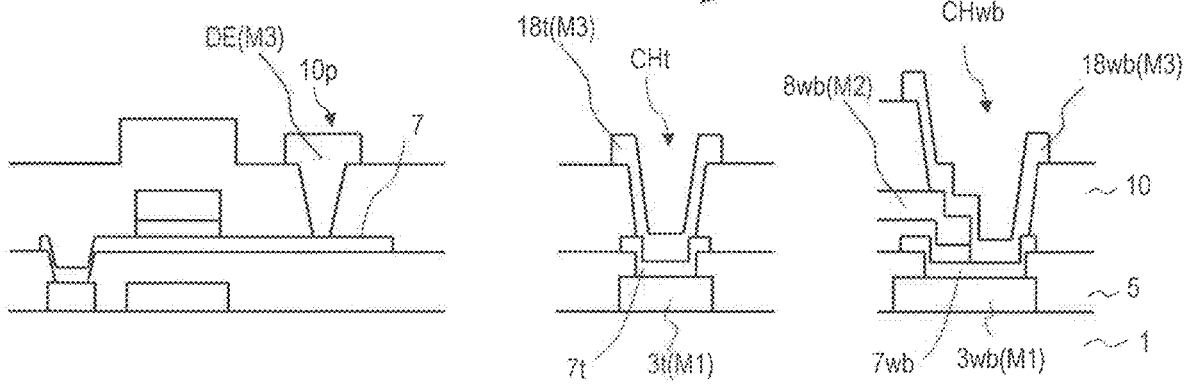

Subsequently, as illustrated in FIG. 17F, by the same method as described above, a drain electrode DE in contact with the oxide semiconductor layer 7 in the opening portion 10p, an upper conductive layer 18t in contact with the oxide layer 7t in the contact hole CHt, and a third coupling layer 18wb in contact with the second coupling layer 8wb and the oxide layer 7wb in the contact hole CHwb are formed.

Thereafter, although not illustrated, by the same method as described above, an upper insulating layer 13, a common electrode CE, a dielectric layer 17, and a pixel electrode PE are formed in this order (STEP 7 to STEP 10) to obtain the active matrix substrate of Modification Example 2.

The structure and the method for manufacturing the active matrix substrate of the present embodiment are not limited to the structure and the method exemplified above. In the above description, the active matrix substrate provided with a top gate type pixel TFT is exemplified. Instead, a bottom gate type pixel TFT or a double gate type pixel TFT having two gates with an oxide semiconductor layer interposed therebetween may be used.

Embodiments of the present invention can be widely applied to devices and electronic devices provided with the TFT. For example, the embodiments can be applied to a circuit substrate such as an active matrix substrate, a liquid crystal display device, an organic EL display device, a display device such as a micro LED display device, an imaging device such as a radiation detector and an image sensor, and an electronic device such as an image input device and a fingerprint reading device.

<About Oxide Semiconductor>

The oxide semiconductor included in the oxide semiconductor layer 7 may be an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor in which a c-axis is substantially perpendicular to a layer surface.

The oxide semiconductor layer 7 may have a laminated structure of two or more layers. In the case where the oxide semiconductor layer 7 has a laminated structure, the oxide semiconductor layer 7 may include an amorphous oxide semiconductor layer and a crystalline oxide semiconductor layer. Alternatively, a plurality of crystalline oxide semiconductor layers having different crystal structures may be included. A plurality of amorphous oxide semiconductor layers may be included. In a case where the oxide semiconductor layer 7 has a two-layer structure including an upper layer and a lower layer, the energy gap of the oxide semiconductor included in a layer located on the gate electrode side (lower layer for bottom gate type, and upper layer for top gate type) of the two layers may be smaller than the energy gap of the oxide semiconductor included in a layer located on a side opposite to the gate electrode (upper layer for bottom gate type, and lower layer for top gate type). However, in a case where the difference in energy gap between these layers is relatively small, the energy gap of the oxide semiconductor in the layer located on the gate electrode side may be larger than the energy gap of the oxide semiconductor in the layer located on the side opposite to the gate electrode.

Materials, structures, film formation methods, structures of oxide semiconductor layers having a laminated structure, and the like of the amorphous oxide semiconductor and each of the above crystalline oxide semiconductors are described in, for example, Japanese Unexamined Patent Application Publication No. 2014-007399. For reference, the entire contents disclosed in Japanese Unexamined Patent Application Publication No. 2014-007399 are incorporated herein.

The oxide semiconductor layer 7 may include, for example, at least one metal element among In, Ga, and Zn. In the present embodiment, the oxide semiconductor layer 7 includes, for example, an In—Ga—Zn—O-based semiconductor (for example, indium gallium zinc oxide). Here, the In—Ga—Zn—O-based semiconductor is a ternary oxide of indium (In), gallium (Ga), and zinc (Zn), a ratio (composition ratio) of In, Ga, and Zn is not particularly limited, and includes, for example, In:Ga:Zn=2:2:1, In:Ga:Zn=1:1:1, In:Ga:Zn=1:1:2, and the like. Such an oxide semiconductor layer 7 can be formed of an oxide semiconductor film including an In—Ga—Zn—O-based semiconductor.

The In—Ga—Zn—O-based semiconductor may be amorphous or crystalline. As the crystalline In—Ga—Zn—O-based semiconductor, a crystalline In—Ga—Zn—O-based semiconductor in which the c-axis is oriented substantially perpendicular to the layer surface is preferable.

The crystal structure of a crystalline In—Ga—Zn—O-based semiconductor is disclosed in, for example, above Japanese Unexamined Patent Application Publication No. 2014-007399, Japanese Unexamined Patent Application Publication No. 2012-134475, and Japanese Unexamined Patent Application Publication No. 2014-209727. For reference, the entire contents disclosed in Japanese Unexamined Patent Application Publication No. 2012-134475 and Japanese Unexamined Patent Application Publication No. 2014-209727 are incorporated herein. A TFT having an In—Ga—Zn—O-based oxide semiconductor layer has high mobility (more than 20 times that of an a-Si TFT) and low leak current (less than 1/100 that of an a-Si TFT). Therefore, the TFT is suitably used as a driving TFT (for example, TFT included in a driving circuit provided on the same substrate as a display region around a display region including a plurality of pixels) and a pixel TFT (TFT provided in a pixel).

The oxide semiconductor layer 7 may include another oxide semiconductor instead of the In—Ga—Zn—O-based semiconductor. For example, an In—Sn—Zn—O-based semiconductor (for example, $In_2O_3$—$SnO_2$—ZnO; InSnZnO) may be included. The In—Sn—Zn—O-based semiconductor is a ternary oxide of indium (In), tin (Sn), and zinc (Zn). Alternatively, the oxide semiconductor layer 7 may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a cadmium oxide (CdO), Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, and the like.

The present invention is not limited to the description of the embodiments above and may be altered within the scope of the claims. Embodiments based on a proper combination of technical means disclosed in different embodiments are encompassed in the technical scope of the present invention. Furthermore, a new technological feature can be created by combining different technological means disclosed in the embodiments.

What is claimed is:

1. An active matrix substrate that includes a display region including a plurality of pixel regions, and a non-display region other than the display region, the active matrix substrate comprising:
   a substrate;
   a plurality of oxide semiconductor TFTs that is supported by the substrate and each disposed in association with the plurality of pixel regions;
   a plurality of gate bus lines that supplies a gate signal to the plurality of oxide semiconductor TFTs;
   a plurality of source bus lines that supplies a source signal to the plurality of oxide semiconductor TFTs;
   at least one trunk wiring that is provided in the non-display region and transmits a signal; and
   a plurality of other wirings, each of which is disposed so as to at least partially overlap the at least one trunk wiring, when viewed from a normal direction of the substrate, wherein
   the active matrix substrate includes
   a first metal layer that includes an electrode and/or a wiring formed of a first conductive film on the substrate,
   a second metal layer that is disposed above the first metal layer with an insulating layer interposed therebetween, and includes an electrode and/or a wiring formed of a second conductive film, and
   a third metal layer that is disposed above the second metal layer with an insulating layer interposed therebetween, and includes an electrode and/or a wiring formed of a third conductive film,
   one of the first metal layer, the second metal layer, and the third metal layer includes the plurality of source bus lines, and other layer includes the plurality of gate bus lines,
   the at least one trunk wiring is formed in two metal layers of the first metal layer, the second metal layer, and the third metal layer, and the plurality of other wirings are formed in other one metal layer, and
   the at least one trunk wiring includes a multilayer structure that includes a lower wiring formed in one of the two metal layers and an upper wiring formed in the other of the two metal layers and disposed on the lower wiring with an insulating layer interposed therebetween, and the lower wiring and the upper wiring are electrically coupled to each other.

2. The active matrix substrate according to claim 1, wherein
   each of the first metal layer, the second metal layer, and the third metal layer is a metal layer containing Cu or Al, or includes a laminated structure including the metal layer as an uppermost layer.

3. The active matrix substrate according to claim 1, wherein
the at least one trunk wiring is a common signal trunk wiring that transmits a common signal, and the plurality of other wirings are the plurality of source bus lines or the plurality of gate bus lines,
the common signal trunk wiring is electrically separated from the plurality of source bus lines and the plurality of gate bus lines,
the common signal trunk wiring includes a first wiring unit intersecting with the plurality of source bus lines and a second wiring unit intersecting with the plurality of gate bus lines, when viewed from the normal direction of the substrate,
the first wiring unit includes a multilayer structure formed in two metal layers other than the source bus lines among the first metal layer, the second metal layer, and the third metal layer, and
the second wiring unit includes a multilayer structure formed in two metal layers other than the gate bus lines among the first metal layer, the second metal layer, and the third metal layer.

4. The active matrix substrate according to claim 3, wherein
the upper wiring or the lower wiring of the common signal trunk wiring includes a cutout portion at an intersection portion of the common signal trunk wiring and the plurality of source bus lines or the plurality of gate bus lines.

5. The active matrix substrate according to claim 1, wherein
each of the plurality of oxide semiconductor TFTs includes an oxide semiconductor layer and a gate electrode disposed on a portion of the oxide semiconductor layer with a gate insulating layer interposed therebetween,
the first metal layer is located closer to the substrate side than the oxide semiconductor layer, and
the second metal layer includes the gate electrode and the plurality of gate bus lines.

6. The active matrix substrate according to claim 5, wherein
the first metal layer includes light shielding layers of the plurality of oxide semiconductor TFTs, and
the third metal layer includes drain electrodes and source electrodes of the plurality of oxide semiconductor TFTs, and the plurality of source bus lines.

7. The active matrix substrate according to claim 5, wherein
the oxide semiconductor layer includes an In—Ga—Zn—O-based semiconductor.

8. The active matrix substrate according to claim 5, wherein
the first metal layer includes source electrodes of the plurality of oxide semiconductor TFTs and the plurality of source bus lines, and
the third metal layer includes drain electrodes of the plurality of oxide semiconductor TFTs.

9. The active matrix substrate according to claim 8, wherein
the plurality of other wirings are a plurality of branch wirings to which the signal is input from the at least one trunk wiring, the active matrix substrate further comprises
a trunk wiring coupling portion that electrically couples each of the branch wirings to the at least one trunk wiring, and
the trunk wiring coupling portion is disposed in a region where each of the branch wirings and the at least one trunk wiring at least partially overlap each other when viewed from the normal direction of the substrate.

10. The active matrix substrate according to claim 8, further comprising:
another oxide semiconductor TFT that is disposed in the non-display region, wherein
a gate electrode of another oxide semiconductor TFT is formed in the second metal layer, a source electrode and a drain electrode of another oxide semiconductor TFT are formed in the third metal layer, and
the first metal layer includes light shielding layers of the plurality of oxide semiconductor TFTs and a light shielding layer of another oxide semiconductor TFT.

11. The active matrix substrate according to claim 9, further comprising:
a gate driver that is disposed in the non-display region and includes a shift register having a plurality of stages, wherein
the at least one trunk wiring is at least one gate driver signal trunk wiring that transmits the signal input to the gate driver, and
the signal is input from the at least one gate driver signal trunk wiring to the plurality of stages of the shift register via the plurality of branch wirings.

12. The active matrix substrate according to claim 9, wherein
the lower wiring of the at least one trunk wiring is formed in the second metal layer, and the upper wiring is formed in the third metal layer, and
the plurality of branch wirings are formed in the first metal layer.

13. The active matrix substrate according to claim 9, wherein
the lower wiring of the at least one trunk wiring is formed in the first metal layer, and the upper wiring is formed in the second metal layer, and
the plurality of branch wirings are formed in the third metal layer.

14. The active matrix substrate according to claim 9, wherein
the lower wiring of the at least one trunk wiring is formed in the first metal layer, and the upper wiring is formed in the third metal layer, and
the plurality of branch wirings are formed in the second metal layer.

15. The active matrix substrate according to claim 14, wherein
the at least one trunk wiring includes a first trunk wiring and a second trunk wiring,
the plurality of branch wirings include a first branch wiring electrically coupled to the first trunk wiring and electrically separated from the second trunk wiring,
the first branch wiring extends to the first trunk wiring across the second trunk wiring, when viewed from the normal direction of the substrate, and
the upper wiring or the lower wiring in the second trunk wiring includes a cutout portion in an intersection portion of the second trunk wiring and the first branch wiring.

16. The active matrix substrate according to claim 9, wherein
each of the plurality of oxide semiconductor TFTs includes an oxide semiconductor layer and a gate electrode disposed on a portion of the oxide semiconductor layer with a gate insulating layer interposed therebetween,
the first metal layer is located closer to the substrate side than the oxide semiconductor layer,
the second metal layer includes the gate electrode and the plurality of gate bus lines,
in the trunk wiring coupling portion, among the upper wiring, the lower wiring, and each of the branch wirings, a wiring formed in the first metal layer includes a first coupling layer, a wiring formed in the second metal layer includes a second coupling layer, and a wiring formed in the third metal layer includes a third coupling layer, and
the trunk wiring coupling portion includes
the first coupling layer,
a lower insulating layer that extends on the first coupling layer and has a first opening portion exposing a portion of the first coupling layer,
the second coupling layer that is disposed on the lower insulating layer and in the first opening portion, and disposed on a first portion of an exposed portion of the first coupling layer in the first opening portion with the gate insulating layer interposed therebetween,
an interlayer insulating layer that extends on the second coupling layer and the lower insulating layer and has a second opening portion exposing a portion of the second coupling layer and a second portion not covered by the gate insulating layer in the exposed portion of the first coupling layer, and
a third coupling layer that is disposed on the interlayer insulating layer and is in contact with the portion of the second coupling layer and the second portion of the first coupling layer in the second opening portion.

17. The active matrix substrate according to claim 9, wherein
each of the plurality of oxide semiconductor TFTs includes an oxide semiconductor layer and a gate electrode disposed on a portion of the oxide semiconductor layer with a gate insulating layer interposed therebetween,
the first metal layer is located closer to the substrate side than the oxide semiconductor layer,
the second metal layer includes the gate electrode and the plurality of gate bus lines,
in the trunk wiring coupling portion, among the upper wiring, the lower wiring, and each of the branch wirings, a wiring formed in the first metal layer includes a first coupling layer, a wiring formed in the second metal layer includes a second coupling layer, and a wiring formed in the third metal layer includes a third coupling layer,
the trunk wiring coupling portion includes
the first coupling layer,
a lower insulating layer that extends on the first coupling layer,
the second coupling layer that is disposed on the lower insulating layer with the gate insulating layer interposed therebetween, and overlaps a first portion of the first coupling layer when viewed from the normal direction of the substrate,
an interlayer insulating layer that extends on the second coupling layer and the lower insulating layer, and a third coupling layer that is disposed on the interlayer insulating layer and in a contact hole made in the interlayer insulating layer and the lower insulating layer, the contact hole including a first opening portion made in the lower insulating layer and a second opening portion made in the interlayer insulating layer, the third coupling layer being in contact with a portion of the second coupling layer and a second portion not overlapping the second coupling layer in the first coupling layer, in the contact hole, and
a portion of a side surface of the first opening portion is aligned with the second opening portion, and the other portion is aligned with a side surface of the second coupling layer, when viewed from the normal direction of the substrate.

18. A method for manufacturing the active matrix substrate according to claim 17, the method comprising:
forming the first metal layer that includes the first coupling layer on the substrate;
forming the lower insulating layer so as to cover the first metal layer;
forming the oxide semiconductor layer of the plurality of oxide semiconductor TFTs, by forming an oxide semiconductor film on the lower insulating layer and patterning the oxide semiconductor film, the oxide semiconductor film being patterned in a state where the first coupling layer is covered with the lower insulating layer;
forming a gate insulating layer and a second metal layer, by forming the gate insulating film and the second conductive film in this order so as to cover the oxide semiconductor layer and patterning the gate insulating film and the second conductive film, the second metal layer including the gate electrode and the second coupling layer;
forming the interlayer insulating layer on the second metal layer;
a step of patterning the interlayer insulating layer and the lower insulating layer using a resist mask provided on the interlayer insulating layer and the second coupling layer as a mask, and making the contact hole exposing a portion of the second coupling layer and the second portion of the first coupling layer; and
forming a third metal layer including the third coupling layer on the interlayer insulating layer.

19. The active matrix substrate according to claim 9, wherein
each of the plurality of oxide semiconductor TFTs includes an oxide semiconductor layer and a gate electrode disposed on a portion of the oxide semiconductor layer with a gate insulating layer interposed therebetween,
the first metal layer is located closer to the substrate side than the oxide semiconductor layer,
the second metal layer includes the gate electrode and the plurality of gate bus lines,
in the trunk wiring coupling portion, among the upper wiring, the lower wiring, and each of the branch wirings, a wiring formed in the first metal layer includes a first coupling layer, a wiring formed in the second metal layer includes a second coupling layer, and a wiring formed in the third metal layer includes a third coupling layer, and
the trunk wiring coupling portion includes
the first coupling layer, a lower insulating layer that extends on the first coupling layer and has a first opening portion exposing a portion of the first coupling layer, an oxide layer that is formed using the same oxide film as the oxide semiconductor layer, and disposed on the lower insulating layer and in the first opening portion, the second coupling layer that is disposed on a portion of the oxide layer with the gate insulating layer interposed therebetween, an interlayer insulating layer that extends on the second coupling layer and the oxide layer, and has a second opening portion exposing a portion of the second coupling layer and the other portion of the oxide layer, and the third coupling layer that is disposed on the interlayer insulating layer and in contact with the portion of the second coupling layer and the other portion of the oxide layer in the second opening portion.

20. A method for manufacturing the active matrix substrate according to claim 19, the method comprising:

forming the first metal layer that includes the plurality of source bus lines, the source electrodes of the plurality of oxide semiconductor TFTs, and the first coupling layer on the substrate;

forming the lower insulating layer so as to cover the first metal layer, and forming a source-side opening portion exposing a portion of the source electrode and the first opening portion exposing the portion of the first coupling layer in the lower insulating layer;

forming the oxide semiconductor layer in contact with the source electrode in the source-side opening portion and the oxide layer in contact with the first coupling layer in the first opening portion, by forming an oxide semiconductor film on the lower insulating layer and patterning the oxide semiconductor film;

forming a gate insulating layer and a second metal layer, by forming the gate insulating film and the second conductive film in this order so as to cover the oxide semiconductor layer and the oxide layer, and patterning the gate insulating film and the second conductive film, the second metal layer including the gate electrode and the second coupling layer;

forming the interlayer insulating layer on the second metal layer, and making a drain-side opening portion exposing a portion of the drain electrode and the second opening portion exposing the portion of the second coupling layer and the other portion of the oxide layer on the interlayer insulating layer; and forming the third metal layer on the interlayer insulating layer, the third metal layer including the drain electrode in contact with the oxide semiconductor layer in the drain-side opening portion and the third coupling layer in contact with the portion of the second coupling layer and the other portion of the oxide layer in the second opening portion.

* * * * *